(12) United States Patent
Chen

(10) Patent No.: US 11,900,866 B2
(45) Date of Patent: Feb. 13, 2024

(54) DISPLAY PANEL AND DISPLAY DEVICE

(71) Applicant: Xiamen Tianma Display Technology Co., Ltd., Xiamen (CN)

(72) Inventor: Guoxing Chen, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/071,000

(22) Filed: Nov. 29, 2022

(65) Prior Publication Data

US 2023/0093268 A1  Mar. 23, 2023

(30) Foreign Application Priority Data

May 31, 2022  (CN) .......................... 202210615764.6

(51) Int. Cl.
*G11C 19/28* (2006.01)
*G09G 3/32* (2016.01)
(Continued)

(52) U.S. Cl.
CPC .............. *G09G 3/32* (2013.01); *G11C 19/28* (2013.01); *G09G 3/3233* (2013.01); *G09G 3/3266* (2013.01); *G09G 3/342* (2013.01); *G09G 2300/0819* (2013.01); *G09G 2300/0842* (2013.01); *G09G 2310/0251* (2013.01); *G09G 2310/0262* (2013.01); *G09G 2310/0286* (2013.01); *G09G 2320/0233* (2013.01); *G09G 2320/0285* (2013.01); *G09G 2320/0626* (2013.01)

(58) Field of Classification Search
CPC ...... G09G 3/32; G09G 3/3233; G09G 3/3266; G09G 3/342; G09G 2300/0819; G09G 2300/0842; G09G 2310/0251; G09G 2310/0262; G09G 2310/0286; G09G 2320/0233; G09G 2320/0285; G09G 2320/0626; G11C 19/28
See application file for complete search history.

(56) References Cited

U.S. PATENT DOCUMENTS

2012/0146979 A1*  6/2012  Kim ..................... G09G 3/3266
345/76
2015/0364083 A1*  12/2015  Jeon ..................... G09G 3/3266
345/76
(Continued)

*Primary Examiner* — Adam J Snyder
(74) *Attorney, Agent, or Firm* — KDW Firm PLLC

(57) ABSTRACT

Provided are a display panel and a display device. The display panel includes a display region, a non-display region bordering two sides of the display region at least in a first direction and a hole-digging region. The distance from the hole-digging region to the non-display region on a first side of the display region is smaller than the distance from the hole-digging region to the non-display region on a second side of the display region. The display region includes pixel circuits and initialization signal lines. The non-display region includes cascaded initialization signal shift register units. The initialization signal shift register unit includes a first initialization signal shift register unit located in the non-display region on the first side of the display region. The first initialization signal shift register unit is electrically connected to a corresponding initialization signal line having a partial line segment extending around the hole-digging region.

17 Claims, 14 Drawing Sheets

(51) Int. Cl.
*G09G 3/3233* (2016.01)
*G09G 3/3266* (2016.01)
*G09G 3/34* (2006.01)

(56) References Cited

U.S. PATENT DOCUMENTS

| | | | | |
|---|---|---|---|---|
| 2016/0321995 A1* | 11/2016 | Shin | ............ | G09G 3/3266 |
| 2018/0144684 A1* | 5/2018 | Jeon | ............ | G09G 3/3266 |
| 2020/0176542 A1* | 6/2020 | Park | ............ | G09G 3/3241 |
| 2020/0211469 A1* | 7/2020 | Jeon | ............ | G09G 3/3266 |
| 2021/0020112 A1* | 1/2021 | Ueno | ............ | G09G 3/3266 |
| 2021/0264857 A1* | 8/2021 | Wang | ............ | G09G 3/3266 |
| 2022/0139324 A1* | 5/2022 | Jeong | ............ | G09G 3/3266 |
| | | | | 345/204 |
| 2022/0301496 A1* | 9/2022 | Park | ............ | G09G 3/3266 |

\* cited by examiner

DISPLAY PANEL AND DISPLAY DEVICE

CROSS-REFERENCE TO RELATED APPLICATION

This application claims priority to Chinese Patent Application No. 202210615764.6 filed May 31, 2022, the disclosure of which is incorporated herein by reference in its entirety.

TECHNICAL FIELD

Embodiments of the present disclosure relate to the field of display technologies and, in particular, relate to a display panel and a display device.

BACKGROUND

With the development of intelligent electronic products including a display panel, such as mobile phones, people's demand for the electronic products having a high screen-to-body ratio is increasing. To achieve a full-screen display, it is often needed to directly place a camera below the display panel, and a hole needs to be dug in the position corresponding to the camera for a backlight assembly. In the driving process of the display panel, when there are many data scan signals, an uneven display is likely to occur on the periphery of a hole-digging region, influencing the overall display of the display panel.

SUMMARY

In view of this, the present disclosure provides a display panel and a display device to improve the issue of unevenness display on the periphery of a hole-digging region and improve the display effect of the display panel.

In a first aspect, embodiments of the present disclosure provide a display panel. The display panel includes a display region and a non-display region bordering two sides of the display region at least in a first direction.

The display panel includes a hole-digging region. In the first direction, the distance from the hole-digging region to the non-display region on a first side of the display region is smaller than the distance from the hole-digging region to the non-display region on a second side of the display region. The first side and the second side are opposite in the first direction.

The display region includes a plurality of pixel circuits and a plurality of initialization signal lines. The plurality of pixel circuits are arranged in an array in the first direction and a second direction. The plurality of initialization signal lines are arranged in sequence in the second direction. At least part of the plurality of initialization signal lines each have a partial line segment extending around the hole-digging region. The second direction intersects the first direction.

The non-display region includes a plurality of cascaded initialization signal shift register units. The plurality of initialization signal shift register units are electrically connected to the plurality of initialization signal lines in a one-to-one correspondence. The plurality of initialization signal shift register units are configured to provide initialization signals to the plurality of pixel circuits through the plurality of initialization signal lines in an initialization stage.

The plurality of initialization signal shift register units include a first initialization signal shift register unit located in the non-display region on a first side of the display region in the first direction. The first initialization signal shift register unit is electrically connected to an initialization signal line that has a partial line segment extending around the hole-digging region and corresponds to the first initialization signal shift register unit.

In a second aspect, an embodiment of the present disclosure further provides a display device. The display device includes the display panel described in the first aspect.

In the embodiments of the present disclosure, a display region and a non-display region are disposed in the display panel. The non-display region borders two sides of the display region at least in a first direction. The display panel further includes a hole-digging region. The distance from the hole-digging region to the non-display region on a first side of the display region is smaller than the distance from the hole-digging region to the non-display region on a second side of the display region. The display region further includes a plurality of pixel circuits and a plurality of initialization signal lines. The non-display region includes a plurality of cascaded initialization signal shift register units. The plurality of initialization signal shift register units are configured to provide initialization signals to the plurality of pixel circuits through the plurality of initialization signal lines in an initialization stage. The plurality of initialization signal shift register units include a first initialization signal shift register unit located in the non-display region on the first side of the display region in the first direction. The first initialization signal shift register unit is electrically connected to an initialization signal line that has the partial line segment extending around the hole-digging region and corresponds to the first initialization signal shift register unit.

With the preceding settings, the first initialization signal shift register unit is relatively close to the hole-digging region so that in the driving process of the pixel circuits, sub-pixels between the first initialization signal shift register unit and the hole-digging region have relatively high brightness. That is, a small portion of the sub-pixels in the display area have relatively high brightness. Moreover, the brightness of the sub-pixels between the hole-digging region and the non-display region on the second side can decrease. Since the distance between the hole-digging region and the non-display region on the second side is relatively large, the difference in the brightness decrease is reduced and almost imperceptible to the eyes, reducing the visual angle difference between the left and right sides of the hole-digging region, improving the brightness uniformity of the display panel, and improving the display effect of the display panel.

DETAILED DESCRIPTION

Figure 1:
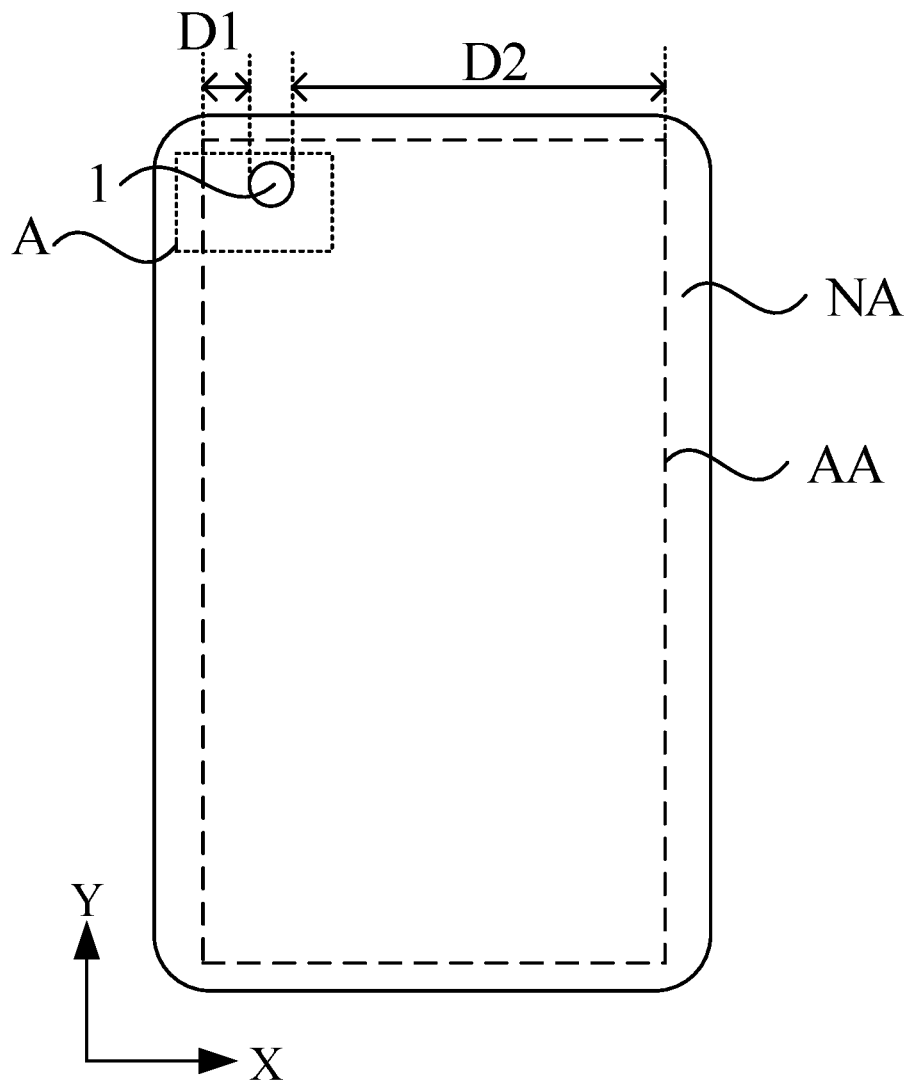
FIG. 1 is a structure view of a display panel according to an embodiment of the present disclosure.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

Figure 2:
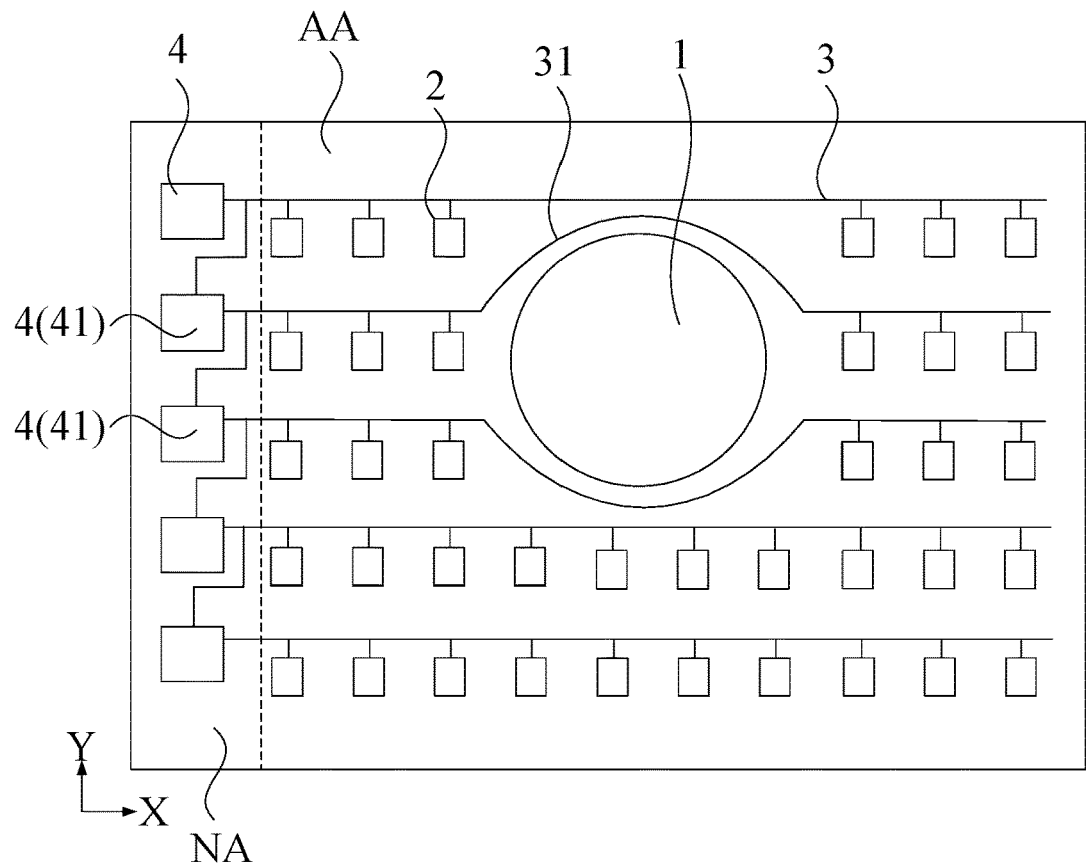
FIG. 2 is an enlarged view of part A of FIG. 1.

Based on the preceding defects in the related art, the embodiments of the present disclosure provide a display panel. FIG. 1 is a structure view of a display panel according to an embodiment of the present disclosure. FIG. 2 is an enlarged view of part A of FIG. 1. As shown in FIGS. 1 and 2, the display panel includes a display region AA and a non-display region NA bordering two sides of the display region AA at least in a first direction X. The display panel further includes a hole-digging region 1. In the first direction X, the distance D1 from the hole-digging region 1 to the non-display region NA on a first side of the display region AA is smaller than the distance D2 from the hole-digging region 1 to the non-display region NA on a second side of the display region AA. The first side and the second side are opposite in the first direction X. The display region AA includes a plurality of pixel circuits 2 and a plurality of initialization signal lines 3. The plurality of pixel circuits 2 are arranged in an array in the first direction X and in a second direction Y. The plurality of initialization signal lines 3 are arranged in sequence in the second direction Y. At least part of the plurality of initialization signal lines 3 each have a partial line segment extending around the hole-digging region 1. The second direction Y intersects the first direction X.

The non-display region NA includes a plurality of cascaded initialization signal shift register units 4. The plurality of initialization signal shift register units 4 are electrically connected to the plurality of initialization signal lines 3 in a one-to-one correspondence. The plurality of initialization signal shift register units 4 are configured to provide initialization signals Dvini to the plurality of pixel circuits 2 through the plurality of initialization signal lines 3 in an initialization stage. The initialization signal shift register units 4 include first initialization signal shift register units 41 located in the non-display region NA on the first side of the display region AA in the first direction X. A first initialization signal shift register unit 41 is electrically connected to a corresponding initialization signal line 3 having a partial line segment extending around the hole-digging region 1.

In an embodiment, referring to FIGS. 1 and 2, in the embodiments of the present disclosure, the display panel includes the display region AA and the non-display region NA bordering two sides of the display region AA at least in the first direction X. That is, at least in the first direction X, the non-display region NA is disposed around the display region AA. The display panel further includes the hole-digging region 1. In the first direction X, the distance D1 from the hole-digging region 1 to the non-display region NA on the first side of the display region AA is smaller than the distance D2 from the hole-digging region 1 to the non-display region NA on the second side of the display region AA. The first side and the second side are opposite in the first direction X. That is, the distances from the hole-digging region 1 to the non-display region NA on the two sides of the display region AA are different. The distance D1 from the hole-digging region 1 to the non-display region NA on the first side of the display region AA is smaller than the distance D2 from the hole-digging region 1 to the non-display region NA on the second side of the display region AA. Exemplarily, FIGS. 1 and 2 show that the hole-digging region 1 is disposed in the display region AA and located on the left side of the axis center of the display area AA in the first direction X. In this case, the non-display region NA on the left side of the display region AA is the non-display region NA on the first side of the display region AA. The non-display region NA on the right side of the display region AA is the non-display region NA on the second side of the display region AA. The actual setting is not limited thereto.

Functional elements, such as a handset (not shown in the figure), a camera (not shown in the figure), and/or various sensors (not shown in the figure) may be placed inside the hole-digging region 1 to achieve functions, such as shooting, optical sensing, and fingerprint identification, thereby improving the screen-to-body ratio of the display panel. The specific setting of the elements inside the hole-digging region 1 is not limited in the embodiments of the present disclosure and the elements inside the hole-digging region 1 can be set by those skilled in the art according to actual requirements.

Referring to FIGS. 1 and 2, the display region AA further includes a plurality of pixel circuits 2 and a plurality of initialization signal lines 3. Each pixel circuit 2 corresponds to one light-emitting module (not shown in the figure). One pixel circuit 2 and one light-emitting module corresponding to the one pixel circuit 2 form one sub-pixel region. The plurality of pixel circuits 2 are arranged in an array in the first direction X and the second direction Y. The first direction X intersects the second direction Y. As shown in FIG. 2, the first direction X is perpendicular to the second direction Y. The actual setting is not limited thereto. In addition, the plurality of initialization signal lines 3 are arranged in sequence in the second direction Y. The pixel circuits 2 in the same row may connect to the same initialization signal line 3. Due to the existence of the hole-digging region 1, the initialization signal lines 3 need to bypass the hole-digging region 1 during wiring. Windings 31 of the initialization signal lines 3 are formed close to the hole-digging region 1, ensuring the connection effect between the initialization signal lines 3 and the pixel circuits 2. In this case, at least part of initialization signal lines 3 each have the partial line segment extending around the hole-digging region 1. That is, the windings 31 of the initialization signal lines 3 close to the hole-digging region 1 extend around the hole-digging region 1.

Still referring to FIG. 2, the non-display region NA includes a plurality of cascaded initialization signal shift register units 4. The plurality of initialization signal shift register units 4 are electrically connected to the plurality of initialization signal lines 3 in a one-to-one correspondence. For example, in FIG. 2, each of the plurality of initialization signal lines 3 is electrically connected to a respective one of the plurality of initialization signal shift register units 4. The initialization signal shift register units 4 are connected in cascade. That is, a signal output terminal of an initialization signal shift register unit 4 at the first level is connected to a signal input terminal of an initialization signal shift register unit 4 at the second level, and a signal output terminal of the initialization signal shift register unit 4 at the second level is electrically connected to a signal input terminal of an initialization signal shift register unit 4 at the third level. The rest can be done in the same manner. In this way, an output signal of an initialization signal shift register unit 4 at the current level can control a shift initialization signal shift register unit 4 at the next level. The initialization signal shift register unit 4 is configured to provide the initialization signal Dvini to the pixel circuits 2 through the initialization signal line 3 in the initialization stage to complete the initialization of the pixel circuits 2.

Further, it is worth mentioning that, in the embodiments of the present disclosure, the initialization signal shift register units 4 include the first initialization signal shift register units 41 located in the non-display region NA on the first side of the display region AA in the first direction X. That is, in the first direction X, the first initialization signal shift register units 41 are located in the non-display region NA close to the hole-digging region 1, and the first initialization signal shift register unit 41 is electrically connected to a corresponding initialization signal line 3 having the partial line segment extending around the hole-digging region 1. It may also be understood that the vertical projection of the initialization signal line 3 connected to the first initialization signal shift register unit 41 in the first direction X at least partially overlaps the vertical projection of the hole-digging region 1 in the first direction X. In the present embodiment, the initialization driving mode of the pixel circuit 2 is unilateral driving. The initialization signal Dvini is provided to the pixel circuits 2 only by the first initialization signal shift register unit 41 disposed in the non-display region NA on one side, so as to improve the screen-to-body ratio and achieve the setting requirements of the narrow bezel.

It is to be understood that the length of the winding 31 increases when the initialization signal line 3 winds around the hole-digging region 1, causing an increase in the resistance of the initialization signal line 3 at the hole-digging region 1. The resistance change has a larger effect on the initialization signal Dvini. That is, the initialization signal Dvini has a relatively large voltage drop when passing through the winding 31 of the hole-digging region 1, causing a brightness difference between sub-pixel regions on the two sides of the hole-digging region 1.

The inventor has found that if the first initialization signal shift register unit 41 is disposed in the non-display region NA facing away from the hole-digging region 1, that is, the non-display region NA on the second side of the display region AA, the distance between the hole-digging region 1 and the non-display region NA on the second side is relatively large, so most of the sub-pixel regions of the display region AA have relatively high brightness, and a small portion of the sub-pixel regions have relatively low brightness, causing the visual angle difference between the left and right sides of the hole-digging region 1 to be relatively large, and the display uniformity of the display panel to be poor.

Therefore, in the embodiments of the present disclosure, the first initialization signal shift register unit 41 is disposed in the non-display region close to the hole-digging region 1.

In this case, the sub-pixel regions between the first initialization signal shift register unit 41 and the hole-digging region 1 have relatively high brightness. That is, a small portion of the sub-pixel regions in the display area AA have relatively high brightness. Moreover, the brightness of the sub-pixel regions between the hole-digging region 1 and the non-display region NA on the second side can decrease. Since the distance between the hole-digging region 1 and the non-display region NA on the second side is relatively large, the difference in the brightness decrease is reduced and almost imperceptible to the eyes, reducing the visual angle difference between the left and right sides of the hole-digging region 1, improving the brightness uniformity of the display panel, and improving the display effect of the display panel.

Exemplarily, FIG. 2 shows two first initialization signal shift register units 41. The actual setting is not limited thereto. In addition, FIG. 2 is only an optional arrangement of the hole-digging region 1, the pixel circuits 2, and the initialization signal lines 3. The actual setting is not limited thereto. Those skilled in the art can set the hole-digging region 1, the pixel circuits 2, and the initialization signal lines 3 according to actual requirements.

The display panel provided by the embodiments of the present disclosure may further include structures, such as a driver chip (not shown in the figure) and a data line (not shown in the figure). The setting of the preceding structures may refer to any related art, and will not be repeated here.

In the embodiments of the present disclosure, the display region and the non-display region are disposed in the display panel, the non-display region borders two sides of the display region at least in the first direction, the display panel also includes the hole-digging region, and the distance from the hole-digging region to the non-display region on the first side of the display region is smaller than the distance from the hole-digging region to the non-display region on the second side of the display region. The display region includes the plurality of pixel circuits and the plurality of initialization signal lines. The non-display region includes the plurality of cascaded initialization signal shift register units. The plurality of initialization signal shift register units are configured to provide the initialization signals to the plurality of pixel circuits through the plurality of initialization signal lines in the initialization stage. The initialization signal shift register units include the first initialization signal shift register unit located in the non-display region on the first side of the display region in the first direction. The first initialization signal shift register unit is electrically connected to the corresponding initialization signal line having the partial line segment extending around the hole-digging region.

With the preceding settings, the first initialization signal shift register unit is relatively close to the hole-digging region. In the driving process of the pixel circuits, the sub-pixel regions between the first initialization signal shift register unit and the hole-digging region have relatively high brightness. That is, a small portion of the sub-pixel regions in the display area have relatively high brightness. Moreover, the brightness of the sub-pixel regions between the hole-digging region and the non-display region on the second side can decrease. Since the distance between the hole-digging region and the non-display region on the second side is relatively large, the difference in the brightness decrease is reduced and almost imperceptible to the eyes, reducing the visual angle difference between the left and right sides of the hole-digging region, improving the brightness uniformity of the display panel, and improving the display effect of the display panel.

Figure 3:
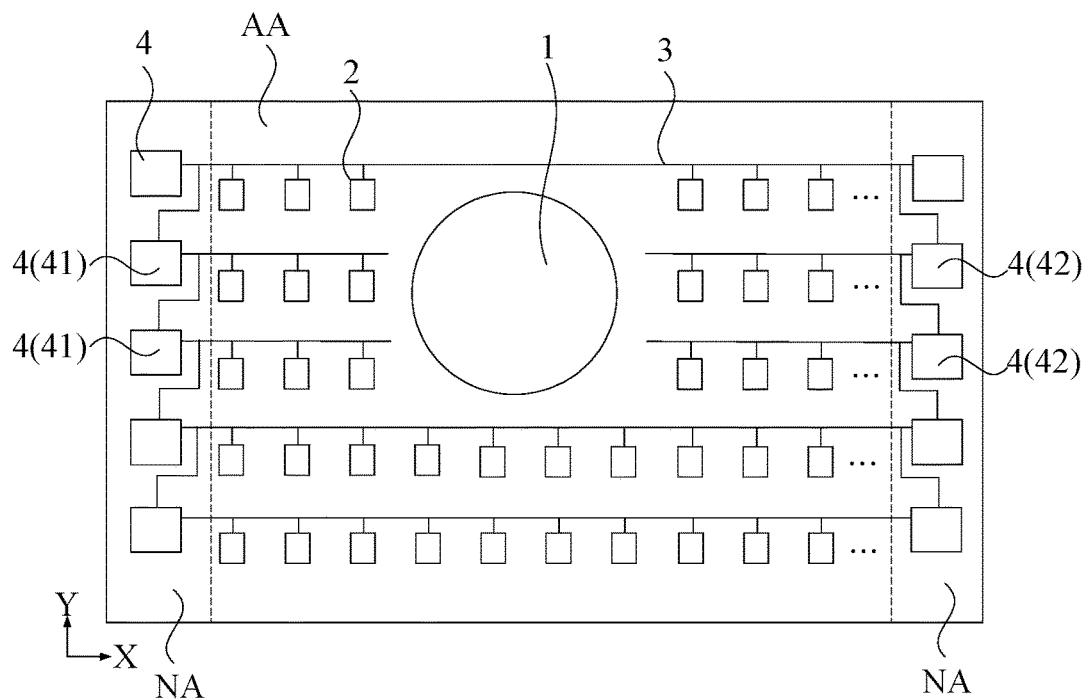
FIG. 3 is a partially enlarged view of a display panel according to an embodiment of the present disclosure.

In an embodiment, FIG. 3 is a partially enlarged view of a display panel according to an embodiment of the present disclosure. As shown in FIG. 3, in an embodiment, the initialization signal shift register units 4 may further include second initialization signal shift register units 42 located in the non-display region NA on the second side of the display region AA in the first direction X. A second initialization signal shift register unit 42 is electrically connected to a corresponding initialization signal line 3 having a partial line segment extending around the hole-digging region 1.

In an embodiment, as shown in FIG. 3, in the present embodiment, the initialization signal shift register units 4 may further include the second initialization signal shift register units 42 located in the non-display region NA on the second side of the display region AA in the first direction X. That is, the second initialization signal shift register units 42 are disposed in the non-display region NA facing away from the hole-digging region 1. The second initialization signal shift register unit 42 is electrically connected to the corresponding initialization signal line 3 having the partial line segment extending around the hole-digging region 1. As shown in FIG. 3, in the first direction X, the first initialization signal shift register unit 41 and second initialization signal shift register unit 42 are disposed opposite to each other in the non-display region NA on two sides of the display region AA.

The second initialization signal shift register unit 42 may also provide the initialization signal Dvini to the pixel circuits 2 through the initialization signal line 3 in the initialization stage. In the present embodiment, the initialization driving mode of the pixel circuit 2 is bilateral driving. That is, the first initialization signal shift register unit 41 transmits a first initialization signal Dv1, the second initialization signal shift register unit 42 transmits a second initialization signal Dv2, and the first initialization signal Dv1 and the second initialization signal Dv2 jointly control and complete the initialization process of the pixel circuit 2.

In the present embodiment, the first initialization signal shift register unit and the second initialization signal shift register unit are provided. The first initialization signal shift register unit and the second initialization signal shift register unit jointly control and complete the initialization working of the pixel circuit. The display brightness uniformity of the sub-pixel regions around the hole-digging region 1 may be adjusted by adjusting the first initialization signal Dv1 and the second initialization signal Dv2.

Exemplarily, in an embodiment, in the initialization stage, it may be set that the absolute value of the first initialization signal Dv1 provided by the first initialization signal shift register unit 41 is smaller than the absolute value of the second initialization signal Dv2 provided by the second initialization signal shift register unit 42.

In an embodiment, since the hole-digging region 1 is relatively close to the first initialization signal shift register unit 41 and relatively far from the second initialization signal shift register unit 42, the voltage drop of the first initialization signal Dv1 transmitted from the first initialization signal shift register unit 41 to the pixel circuit 2 around the hole-digging region 1 is relatively small while the voltage drop of the second initialization signal Dv2 transmitted from the second initialization signal shift register unit 42 to the pixel circuit 2 around the hole-digging region 1 is relatively large. In this case, it may be set that the absolute value of the first initialization signal Dv1 is smaller than the absolute value of the second initialization signal Dv2 so that the first initialization signal Dv1 and the second initialization signal Dv2 have similar or same voltage values when reaching the pixel circuit 2 around the hole-digging region 1, reducing the brightness difference between the sub-pixel regions on the two sides of the hole-digging region 1, and improving the display uniformity.

Figure 4:
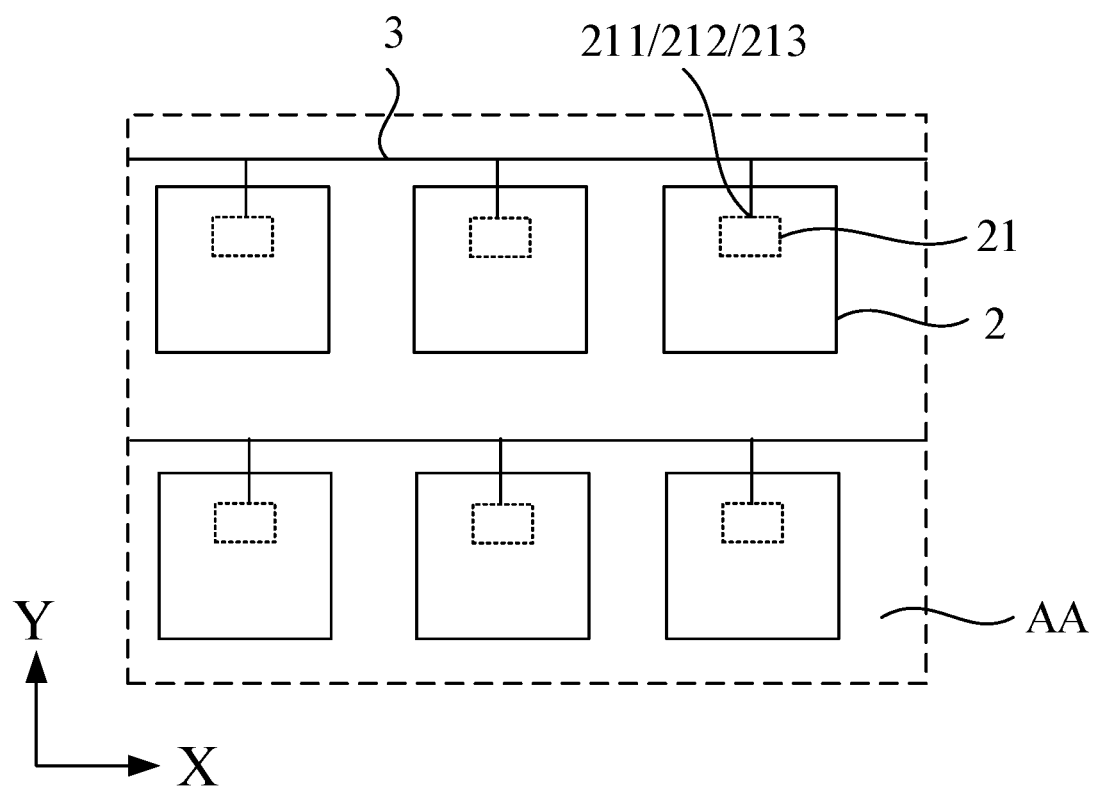
FIG. 4 is a partially enlarged view of another display panel according to an embodiment of the present disclosure.
Figure 5:
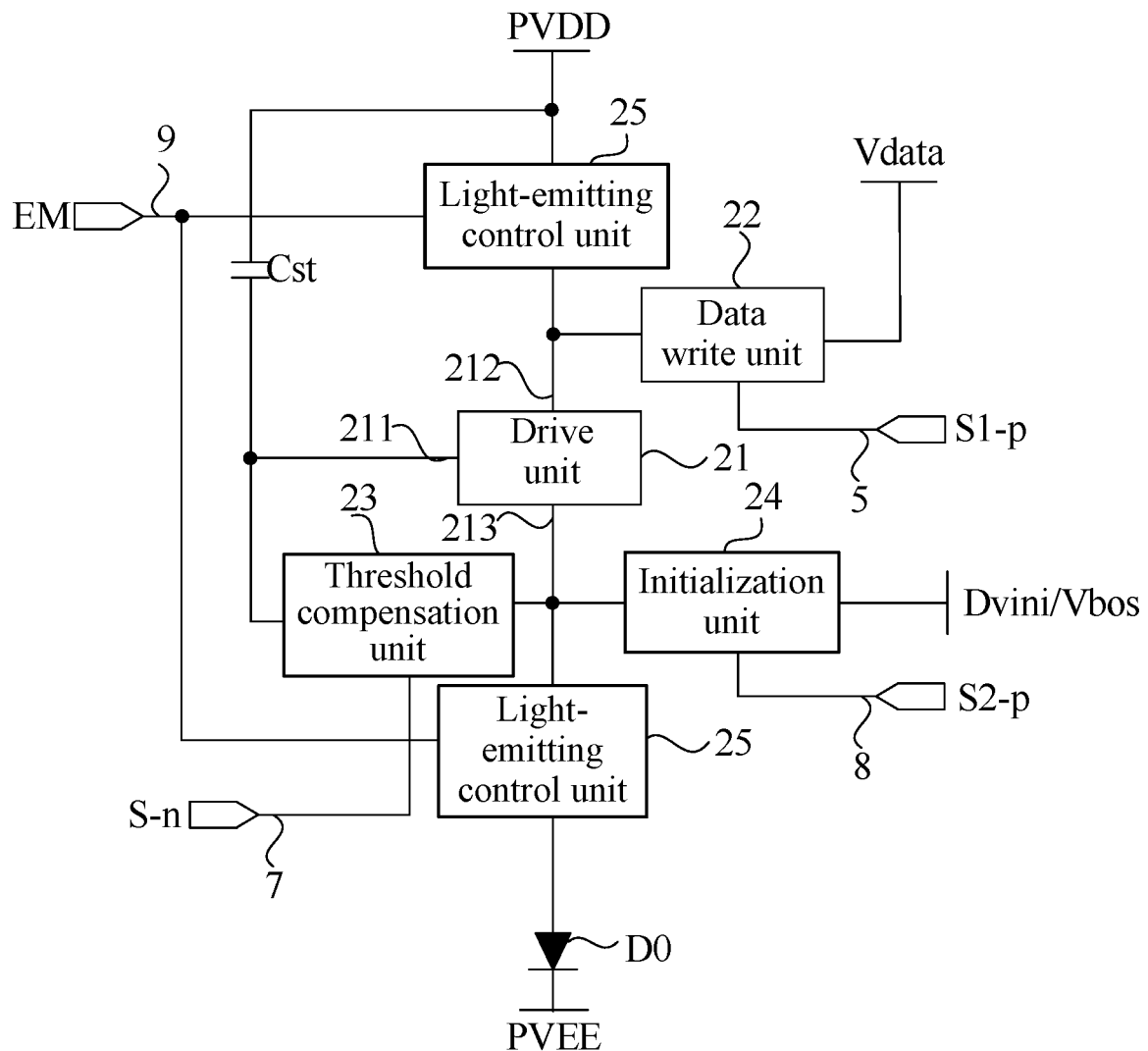
FIG. 5 is a structure view of a pixel circuit according to an embodiment of the present disclosure.

In an embodiment, FIG. 4 is a partially enlarged view of another display panel according to an embodiment of the present disclosure. FIG. 5 is a structure view of a pixel circuit according to an embodiment of the present disclosure. Referring to FIGS. 1, 4, and 5, in an embodiment, a pixel circuit 2 includes a drive unit 21, in pixel circuits 2 arranged in sequence in a first direction X, one of a control terminal 211, an input terminal 212, or an output terminal 213 of each drive unit 21 is electrically connected to the same initialization signal line 3.

In an embodiment, as shown in FIGS. 1, 4, and 5, the pixel circuit 2 may include the drive unit 21. The drive unit 21 includes the control terminal 211, the input terminal 212, or the output terminal 213. In the pixel circuits 2 arranged in the first direction X, i.e., the row direction shown in the figure, one of the control terminal 211, the input terminal 212, or the output terminal 213 of the drive unit 21 of each pixel circuit is electrically connected to the same initialization signal line 3. That is, drive units 21 of the pixel circuits 2 arranged in the first direction X are electrically connected to the same initialization signal line 3. In the initialization stage, the drive units 21 in the same row direction completes the initialization working according to an initialization signal Dvini provided by the same initialization signal shift register unit 4.

Still referring to FIGS. 4 and 5, in an embodiment, in the pixel circuits 2 arranged in the first direction X, the input terminal 212 or the output terminal 213 of each drive unit 21 is electrically connected to the same initialization signal line 3. The initialization signal shift register unit 4 is further configured to provide a bias signal Vobs to the pixel circuits 2 through the initialization signal line 3 in a bias stage.

In the embodiments of the present disclosure, it may be set that the input terminals 212 or the output terminals 213 of the drive units 21 in the same row are electrically connected to the same initialization signal line 3. Exemplarily, FIGS. 4 and 5 show the output terminals 213 of the drive units 21 are electrically connected to the same initialization signal line 3. The actual setting is not limited thereto. It is worth mentioning that, in the present embodiment, in the bias stage, the initialization signal shift register unit 4 may also provide the bias signal Vobs to the pixel circuits 2 through the initialization signal line 3. That is, each initialization signal shift register unit 4 provides the bias signal Vobs to the pixel circuits 2 connected thereto through the same initialization signal line 3.

When the drive unit 21 is a drive transistor, and when the pixel circuit 2 is in a non-bias stage such as a light-emitting stage, the drive transistor is in an on state, the potential at the control terminal, that is, the gate of the drive transistor is larger than the potential at the input terminal, that is, the source of the drive transistor. Such a setting, if performed for a long time, causes the polarization of ions inside the drive transistor, thereby forming a built-in electric field inside the drive transistor, causing the threshold voltage of the drive transistor to drift, and affecting the drive current flowing into the light-emitting module, thereby affecting the display uniformity.

In the present embodiment, the bias stage is added to the working process of the pixel circuit 2. In the bias stage, the initialization signal shift register unit 4 may transmit the bias signal Vobs to the drive unit 21. The bias signal Vobs is transmitted to the input terminal 212 or the output terminal 213 of the drive unit 21 through the initialization signal line 3 to adjust the potential at the input terminal 212 or the output terminal 213 of the drive unit 21, thereby reducing the threshold voltage drift of the drive unit 21.

The specific magnitude of the bias signal Vobs is not limited in the embodiments of the present disclosure. Exemplarily, in some cases, it is feasible to make the voltage of the bias signal Vobs lower than the voltage of the gate of the drive transistor so that the potential of the source or the potential of the drain of the drive transistor is lower than the potential of the gate, making the drive transistor reversely biased, thereby reducing the degree of the polarization of ions inside the drive transistor, reducing the threshold voltage of the drive transistor, and adjusting the drive transistor through the bias signal Vobs.

In the present embodiment, the bias signal Vobs is provided to the drive unit in the bias stage so that the potential difference among the control terminal, the input terminal, and the output terminal of the drive module can be adjusted to balance the increment of the threshold voltage of the drive unit in the non-bias stage, thereby adjusting the drive current flowing into the light-emitting module, and improving the display uniformity of the display panel.

In an embodiment, in the bias stage, a first bias signal Vo1 provided by the first initialization signal shift register unit 41 is smaller than a second bias signal Vo2 provided by the second initialization signal shift register unit 42.

Similarly, since the hole-digging region 1 is relatively close to the first initialization signal shift register unit 41 and relatively far from the second initialization signal shift register unit 42, the voltage drop of the first bias signal Vo1 transmitted from the first initialization signal shift register unit 41 to the winding 31 at the hole-digging region 1 is relatively small while the voltage drop of the second bias signal Vo2 transmitted from the second initialization signal shift register unit 42 to the winding 31 at the hole-digging region 1 is relatively large. When in a bias state, it may be set that the first bias signal Vo1 is smaller than the second bias signal Vo2 so that the first bias signal Vo1 and the second bias signal Vo2 have similar or same voltage values when reaching the pixel circuit 2 around the hole-digging region 1, making the potential difference among the control terminal 211, the input terminal 212, and the output terminal 213 of each of the drive units 21 around the hole-digging region 1 have a similar or same adjustment degree, reducing the brightness difference between the sub-pixel regions on the two sides of the hole-digging region 1.

The specific magnitudes of the first bias signal Vo1 and the second bias signal Vo2 are not limited in the embodiments of the present disclosure and can be set by those skilled in the art according to actual situations.

In another embodiment, it may also be set that the ratio of the first initialization signal Dv1 provided by the first initialization signal shift register unit 41 in the initialization stage to the first bias signal Vo1 provided by the first initialization signal shift register unit 41 in the bias stage is equal to the ratio of the second initialization signal Dv2 provided by the second initialization signal shift register unit 42 in the initialization stage to the second bias signal Vo2 provided by the second initialization signal shift register unit 42 in the bias stage.

In an embodiment, in the present embodiment, it may further be set that the ratio of the first initialization signal Dv1 to the first bias signal Vo1 is equal to the ratio of the second initialization signal Dv2 to the second bias signal Vo2, that is, $Vi1/Vo1=Vi2/Vo2$. Thus, the display brightness difference of the pixel circuits 2 around the hole-digging region 1 is reduced and the display uniformity is improved.

Figure 6:
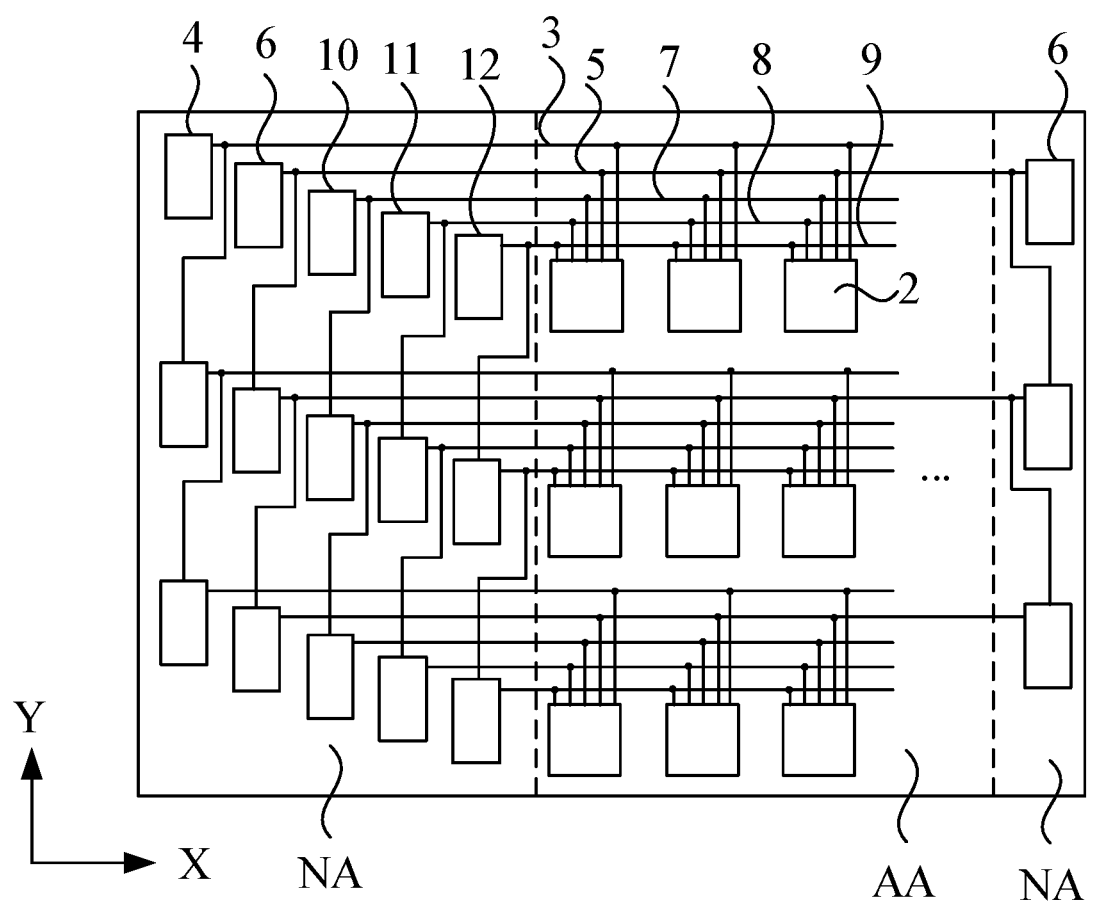
FIG. 6 is a structure view of another display panel according to an embodiment of the present disclosure.

In an embodiment, FIG. 6 is a structure view of another display panel according to an embodiment of the present disclosure. As shown in FIG. 6, in an embodiment, a display region AA may further include a plurality of data write scan signal lines 5 arranged in sequence in a second direction Y. A pixel circuit 2 includes a data write unit 22. In pixel circuits 2 arranged in sequence in a first direction X, control terminals of the data write units 22 are electrically connected to the same data write scan signal line 5. A non-display region NA includes a plurality of cascaded data write shift register units 6. Two ends of a data write scan signal line 5 of the plurality of data write scan signal lines 5 are each connected to one data write shift register unit 6, and the data write shift register unit 6 is configured to provide a data write control signal S1-p to the control terminal of the data write unit 22 corresponding to and electrically connected to the data write shift register unit 6.

In an embodiment, referring to FIGS. 5 and 6, the display region AA may further include the plurality of data write scan signal lines 5 arranged in sequence in the second direction Y. The data write unit 22 is also disposed in the pixel circuit 2. In the pixel circuits 2 arranged in the first direction, that is, the row direction shown in the figure, the control terminal of the data write unit 22 of each pixel circuit is electrically connected to the same data write scan signal line 5.

Meanwhile, the plurality of cascaded data write shift register units 6 are also disposed in the non-display region NA. Two ends of the data write scan signal line 5 are each connected to one data write shift register unit 6. That is, in the first direction X, the cascaded data write shift register units 6 are disposed in the non-display region NA on two sides of the display region AA. The driving mode of the data write unit 22 in each pixel circuit 2 is bilateral driving. In the driving process of the pixel circuit 2, the data write shift register unit 6 provides the data write control signal S1-p to the control terminal of the data write unit 22 corresponding to and electrically connected to the data write shift register unit 6 through the data write scan signal line 5.

In an embodiment, the control terminal of the data write unit 22 is connected to the data write shift register unit 6 to receive the data write control signal S1-p. A first terminal of the data write unit 22 may receive a data signal Vdata. A second terminal of the data write unit 22 may be connected to an input terminal 212 of a drive unit 21. In a data write stage of the pixel circuit 2, the control terminal of the data write unit 22 receives an effective pulse signal of the data write control signal S1-p, such as a high-level signal. In this case, the data write unit 22 is turned on, the data signal Vdata is transmitted to the input terminal 212 of the drive unit 21 through the data write unit 22. Meanwhile, the drive unit 21 is turned on to complete the writing of the data signal Vdata. The specific working mode of the data write unit 22 is not limited to the preceding mode and can be set by those skilled in the art according to actual requirements.

In the driving process of the sub-pixel circuits 2 arranged in sequence in the first direction X, since the data write control signal S1-p has a larger effect on the light-emitting brightness of the sub-pixel light-emitting module, in the present embodiment, the data write shift register units 6 are disposed in the non-display region NA on two sides of the display region AA so that the light-emitting effect of the sub-pixel regions in the same row in the display region AA is relatively uniform.

In an embodiment, still referring to FIGS. 5 and 6, the display region AA may further include a plurality of threshold compensation scan signal lines 7, a plurality of initialization scan signal lines 8, and a plurality of light-emitting control scan signal lines 9. The plurality of threshold compensation scan signal lines 7 are arranged in sequence in the second direction Y. The plurality of initialization scan signal lines 8 are arranged in sequence in the second direction Y. The plurality of light-emitting control scan signal lines 9 are arranged in sequence in the second direction Y. The pixel circuit 2 includes a threshold compensation unit 23, an initialization unit 24, and a light-emitting control unit 25. In the pixel circuits 2 arranged in sequence in the first direction X, control terminals of the threshold compensation units 23 are electrically connected to the same threshold compensation scan signal line 7, control terminals of the initialization units 24 are electrically connected to the same initialization scan signal line 8, and control terminals of the light-emitting control units 25 are electrically connected to the same light-emitting control scan signal line 9.

The non-display region NA includes a plurality of cascaded threshold compensation shift register units 10, a plurality of cascaded initialization shift register units 11, and a plurality of cascaded light-emitting control shift register units 12. The plurality of threshold compensation shift register units 10 are electrically connected to the plurality of threshold compensation scan signal lines 7 in a one-to-one correspondence. A threshold compensation shift register unit 10 is configured to provide a threshold compensation control signal S-n to the control terminal of the threshold compensation unit 23 corresponding to and electrically connected to the threshold compensation shift register unit 10. The plurality of initialization shift register units 11 are electrically connected to the plurality of initialization scan signal lines 8 in a one-to-one correspondence. An initialization shift register unit 11 is configured to provide an initialization control signal S2-p to the control terminal of the initialization unit 24 corresponding to and electrically connected to the initialization shift register unit 11. The plurality of light-emitting control shift register units 12 are electrically connected to the plurality of light-emitting control scan signal lines 9 in a one-to-one correspondence. A light-emitting control shift register unit 12 is configured to provide a light-emitting control signal EM to the control terminal of the light-emitting control unit 25 corresponding to and electrically connected to the light-emitting control shift register unit 12.

In an embodiment, as shown in FIGS. 5 and 6, the display region AA may further include the plurality of threshold compensation scan signal lines 7, the plurality of initialization scan signal lines 8, and the plurality of light-emitting control scan signal lines 9. The plurality of threshold compensation scan signal lines 7 are arranged in sequence in the second direction Y. The plurality of initialization scan signal lines 8 are arranged in sequence in the second direction Y. The plurality of light-emitting control scan signal lines 9 are arranged in sequence in the second direction Y. The pixel circuit 2 may include the threshold compensation unit 23, the initialization unit 24, and the light-emitting control unit 25. In the pixel circuits 2 arranged in sequence in the first direction X, the control terminals of the threshold compensation units 23 are electrically connected to the same threshold compensation scan signal line 7, the control terminals of the initialization units 24 are electrically connected to the same initialization scan signal line 8, and the control terminals of the light-emitting control units 25 are electrically connected to the same light-emitting control scan signal line 9.

The non-display region NA further includes the plurality of cascaded threshold compensation shift register units 10. The plurality of threshold compensation shift register units 10 are electrically connected to the plurality of threshold compensation scan signal lines 7 in a one-to-one correspondence. That is, the plurality of threshold compensation shift register units 10 are disposed in the non-display region NA on only one side of the display region AA. The threshold compensation shift register unit 10 may provide the threshold compensation control signal S-n to the control terminals of the threshold compensation units 23 corresponding to and electrically connected to the threshold compensation shift register unit 10 through the threshold compensation scan signal line 7. The threshold compensation unit 23 may compensate the threshold voltage of the drive unit 21 according to the threshold compensation control signal S-n to eliminate the effect of the threshold voltage of the drive unit 21 on the drive current and to ensure the light-emitting effect of a light-emitting element DO in the light-emitting module.

The non-display region NA further includes a plurality of cascaded initialization shift register units 11. The plurality of initialization shift register units 11 are electrically connected to the plurality of initialization scan signal lines 8 in a one-to-one correspondence. That is, the plurality of initialization shift register units 11 are disposed in the non-display region NA on only one side of the display region AA. The initialization shift register unit 11 may provide the initialization control signal S2-p to the control terminals of the initialization units 24 corresponding to and electrically connected to the initialization shift register unit 11 through the initialization scan signal line 8. The initialization unit 24 is turned on or off according to the initialization control signal S2-p. When the initialization unit 24 is turned on, an initialization signal Dvini provided by an initialization signal shift register unit 4 is transmitted to the drive unit 21 through the initialization unit 24.

The non-display region NA further includes the plurality of cascaded light-emitting control shift register units 12. The plurality of light-emitting control shift register units 12 are electrically connected to the plurality of light-emitting control scan signal lines 9 in a one-to-one correspondence. That is, the plurality of cascaded light-emitting control shift register units 12 are disposed in the non-display region NA on only one side of the display region AA. The light-emitting control shift register unit 12 may provide the light-emitting control signal EM to the control terminals of the light-emitting control units 25 corresponding to and electrically connected to the light-emitting control shift register unit 12 through the light-emitting control scan signal line 9. The light-emitting control unit 25 is turned on or off according to the light-emitting control signal EM.

In the present embodiment, the threshold compensation shift register units 10 are disposed in the non-display region NA on only one side of the display region AA, the initialization shift register units 11 are disposed in the non-display region NA on only one side of the display region AA, and the light-emitting control shift register units 12 are disposed in the non-display region NA on only one side of the display region AA. In this manner, the area occupied by the bezel circuit can be reduced, and the narrow bezel design of the display panel can be achieved.

Figure 7:
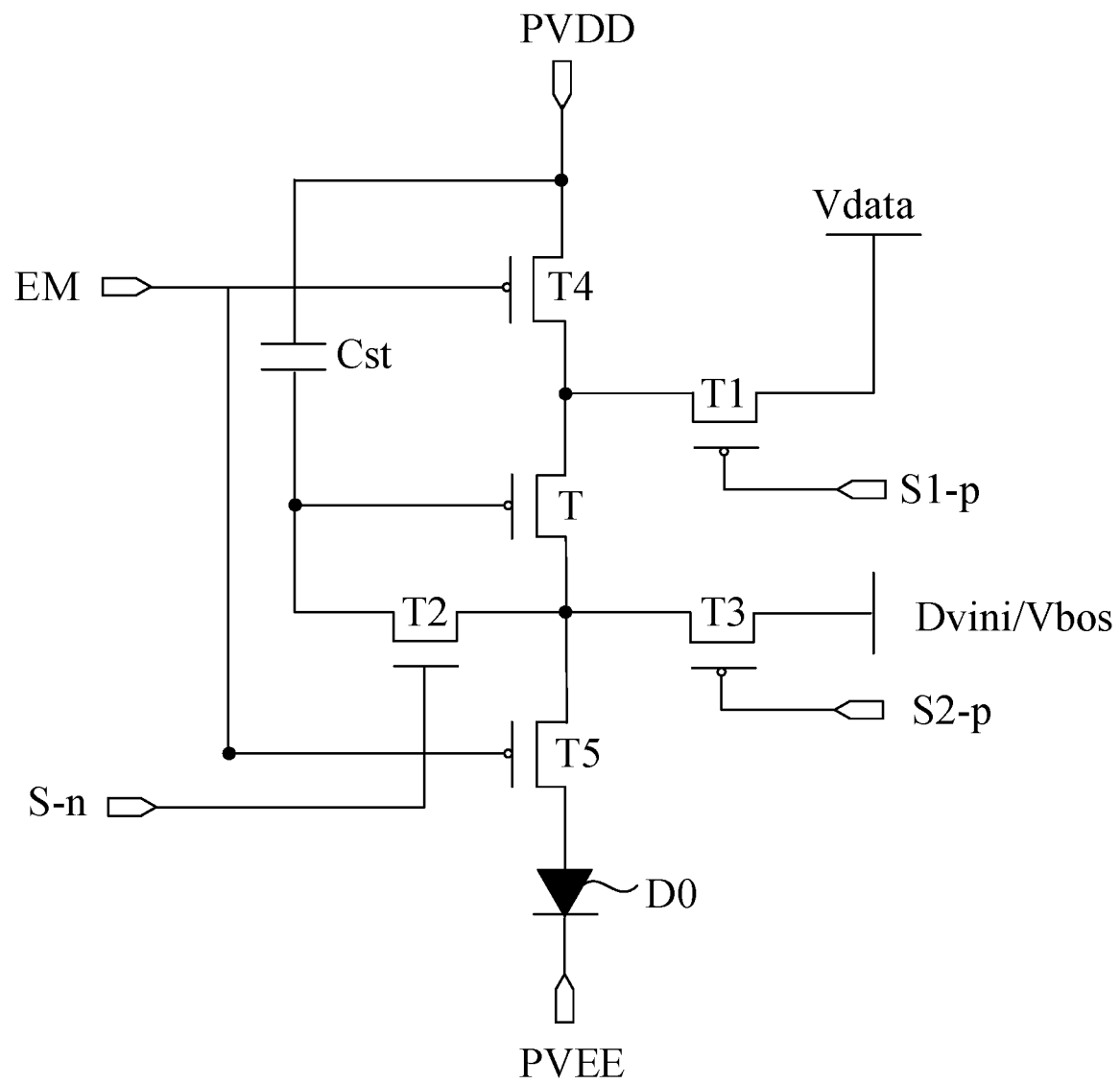
FIG. 7 is a structure view of another pixel circuit according to an embodiment of the present disclosure.

FIG. 7 is a structure view of another pixel circuit according to an embodiment of the present disclosure. In the pixel circuit 2 shown in FIG. 7, the drive unit 21 includes a drive transistor T. The data write unit 22 includes a data write transistor T1. The threshold compensation unit 23 includes a threshold compensation transistor T2. The initialization unit 24 includes an initialization transistor T3. The light-emitting control unit 25 may include a first light-emitting control transistor T4 and a second light-emitting control transistor T5. A first electrode of the data write transistor T1 receives the data signal Vdata. A second electrode of the data write transistor T1 is connected to a first electrode of the drive transistor T. A gate of the data write transistor T1 receives the data write control signal S1-p. A gate of threshold compensation transistor T2 receives a threshold scan control signal S-n. A first electrode of the threshold compensation transistor T2 is connected to a second electrode of the initialization transistor T3. A second electrode of the threshold compensation transistor T2 is connected to a gate of drive transistor T. A gate of the initialization transistor T3 receives the initialization control signal S2-p. A first electrode of the initialization transistor T3 receives the initialization signal Dvini or the bias signal Vobs. A gate of the first light-emitting control transistor T4 receives the light-emitting control signal EM. A gate of the second light-emitting control transistor T5 receives the light-emitting control signal EM. A first electrode of the first light-emitting control transistor T4 is connected to a first power signal PVDD. A second electrode of the first light-emitting control transistor T4 is connected to the first electrode of the drive transistor T. A first electrode of the second light-emitting control transistor T5 is connected to a second electrode of the drive transistor T. A second electrode of the second light-emitting control transistor T5 is connected to a light-emitting element D0.

The working process of the pixel circuit 2 may be roughly described as follows. In an initialization stage, the threshold compensation transistor T2 is turned on according to the threshold compensation control signal S-n, the initialization transistor T3 is turned on according to the initialization control signal S2-p, meanwhile, the data write transistor T1 is turned off according to the data write control signal S1-p, the first light-emitting control transistor T4 and the second light-emitting control transistor T5 are turned off according to the light-emitting control signal EM, and the initialization signal Dvini is transmitted to the gate of drive transistor T through the initialization transistor T3 and the threshold compensation transistor T2 to reset the gate of the drive transistor T.

In a data write stage, the threshold compensation transistor T2 is turned on according to the threshold compensation control signal S-n, the data write transistor T1 is turned on according to the data write control signal S1-p, the initialization transistor T3 is turned on according to the initialization control signal S2-p, meanwhile, the first light-emitting control transistor T4 and the second light-emitting control transistor T5 are turned off according to the light-emitting control signal EM, a data signal terminal provides the data signal Vdata to the first electrode of the drive transistor T through the data write transistor T1, and meanwhile, the data signal Vdata is written in the drive transistor T through the data write transistor T1 and the threshold compensation transistor T2.

In a light-emitting stage, the threshold compensation transistor T2 is turned off according to the threshold compensation control signal S-n, the initialization transistor T3 is turned off according to the initialization control signal S2-p, the data write transistor T1 is turned off according to the data write control signal S1-p, meanwhile, the first light-emitting control transistor T4 and the second light-emitting control transistor T5 are turned on according to the light-emitting control signal EM, a first power voltage terminal transmits the first power signal PVDD to the first electrode of the drive transistor T, meanwhile, the data signal Vdata written in the data write stage controls the gate of the drive transistor T to turn on, and the first power signal PVDD is transmitted to the light-emitting element D0 through the first light-emitting control transistor T4, the drive transistor T, and the second light-emitting control transistor T5 to drive the light-emitting element D0 to emit light.

In a bias stage, the threshold compensation transistor T2 is turned off according to the threshold compensation control signal S-n, the initialization transistor T3 is turned on according to the initialization control signal S2-p, at this time, the initialization signal shift register unit 4 provides the bias signal Vobs through the initialization signal line 3, the bias signal Vobs is transmitted to the second electrode of the drive transistor T through the initialization transistor T3 to make the drive transistor T reversely biased, thereby reducing the threshold voltage of the drive transistor T.

FIGS. 6 and 7 merely exemplarily show an optional arrangement of the threshold compensation shift register unit 10, the threshold compensation unit 23, the initialization shift register unit 11, the initialization scan signal line 8, the initialization unit 24, the light-emitting control shift register unit 12, the light-emitting control scan signal line 9, and the light-emitting control unit 25. The actual setting is not limited thereto. When the setting of the preceding elements and signal lines is different, the driving process of the pixel circuit 2 accordingly varies.

The specific setting positions of the threshold compensation shift register unit 10, the initialization shift register unit 11, and the light-emitting control shift register unit 12 in the non-display region NA are not limited in the embodiments of the present disclosure and can be set by those skilled in the art according to actual requirements.

Figure 8:
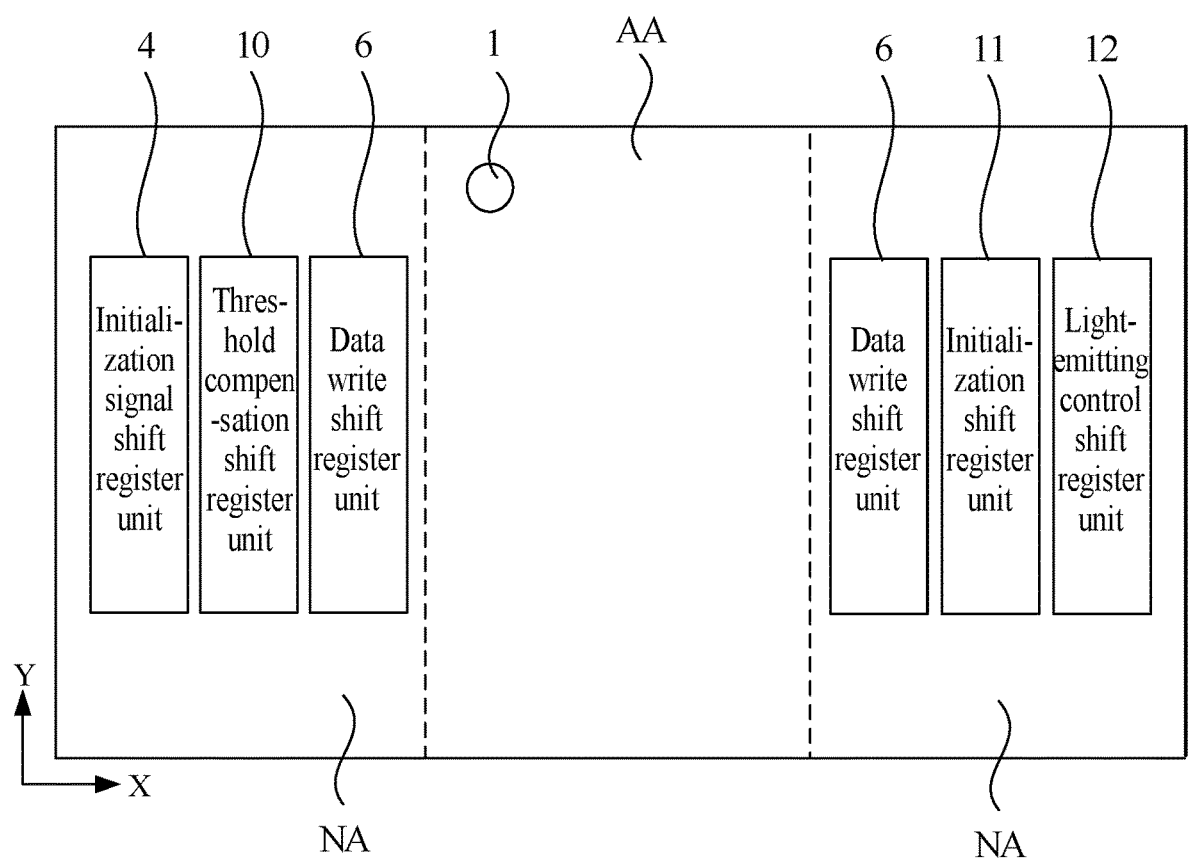
FIG. 8 is a structure view of another display panel according to an embodiment of the present disclosure.

Exemplarily, FIG. 8 is a structure view of another display panel according to an embodiment of the present disclosure. As shown in FIG. 8, in an embodiment, a threshold compensation shift register unit 10 is located in a non-display region NA on one side of a display region AA in a first direction X and an initialization shift register unit 11 is located in the non-display region NA on the other side of the display region AA in a first direction X, respectively.

In an embodiment, it can be known from the preceding embodiments, to achieve the narrow bezel, the threshold compensation shift register unit 10 or the initialization shift register unit 11 may be disposed in the non-display region NA on only one side of the display region AA. That is, both a threshold compensation unit 23 and an initialization unit 14 are configured to be unilateral driving. In the present embodiment, as shown in FIG. 8, in the first direction X, the threshold compensation shift register unit 10 may be disposed in the non-display region NA on one side of the display region AA and the initialization shift register unit 11 may be disposed in the non-display region NA on the other side of the display region AA, respectively. That is, the threshold compensation shift register unit 10 and the initialization shift register unit 11 are disposed in the non-display region NA on different sides.

From the start to the end of the initialization stage, a threshold compensation control signal S-n provided by the threshold compensation shift register unit 10 to threshold compensation units 23 has different levels. For example, the threshold compensation control signal S-n is converted from a high level to a low level to control the threshold compensation unit 23 to convert from an on state to an off state. A delay may exist when the level is switched. In an embodiment, the transmission of the threshold compensation control signal S-n on the same threshold compensation scan signal line 7 may be delayed so as to cause a leakage current in the turn-off process of the threshold compensation unit 23. The farther the pixel circuit 2 from the threshold compensation shift register unit 10, the more severe the delay of the threshold compensation control signal S-n, and as a result, the more apparent the leakage current of the threshold compensation unit 23 in the pixel circuit 2 at a distal end of the threshold compensation shift register unit 10. The leakage current is transmitted to a control terminal of a drive unit 21, causing an increase in the potential of the control terminal of the drive unit 21. However, the potential of the control terminal of the drive unit 21 is negatively correlated with the light-emitting brightness of a light-emitting element D0. When the potential of the control terminal of the drive unit 21 is relatively high, the light-emitting brightness of the light-emitting element D0 is relatively low. That is, the farther the pixel circuit 2 from the threshold compensation shift register unit 10, the lower the light-emitting brightness of the light-emitting element D0 in the pixel circuit 2.

Similarly, the transmission of the initialization control signal S2-$p$ on the same initialization scan signal line 8 may be delayed so as to cause a leakage current in the turn-off process of the initialization unit 24. The farther the pixel circuit 2 from the initialization shift register unit 11, the more severe the delay of the initialization control signal S2-$p$, and also as a result, the more apparent the leakage current of the initialization unit 24 in the pixel circuit 2 at the distal end of the initialization shift register unit 11. The leakage current is transmitted to the control terminal of the drive unit 21, causing an increase in the potential of the control terminal of the drive unit 21 and a decrease in the light-emitting brightness of the light-emitting element D0. That is, the farther the pixel circuit 2 from the initialization shift register unit 11, the lower the brightness of the light-emitting element D0 in the pixel circuit 2.

Based on this, in the embodiments of the present disclosure, the threshold compensation shift register unit 10 and the initialization shift register unit 11 may be disposed in the non-display region NA on different sides of the display region AA so as to counteract the issue of brightness reduction of the light-emitting element D0 caused by the signal delay, and to improve the display uniformity of the display panel.

Still referring to FIG. 8, in an embodiment, initialization signal shift register units 4 are located on the same side of the display region AA in the first direction X. An initialization signal shift register unit 4 is located in the non-display region NA on one side of the display region AA in the first direction X and a light-emitting control shift register unit 12 is located in the non-display region NA on the other side of the display region AA in the first direction X, respectively.

In an embodiment, as shown in FIG. 8, in the first direction X, the initialization signal shift register units 4 may be all disposed in the non-display region NA on the same side of the display region AA to reduce the setting area of the bezel circuit. For example, the initialization signal shift register units 4 may be all disposed in the non-display region NA on a first side of the display region AA. That is, the initialization signal shift register units 4 are all disposed in the non-display region NA close to the hole-digging region 1, thereby reducing the visual angle difference between the left and right sides of the hole-digging region 1, improving the brightness uniformity of the display panel, and improving the display effect of the display panel.

Meanwhile, the light-emitting control shift register unit 12 and the initialization signal shift register unit 4 are disposed in the non-display region NA on different sides. That is, the initialization signal shift register unit 4 is located in the non-display region NA on one side of the display region AA in the first direction X and the light-emitting control shift register unit 12 is located in the non-display region NA on the other side of the display region AA in the first direction X respectively so as to improve the setting uniformity of the bezel circuit of the display panel.

Figure 9:
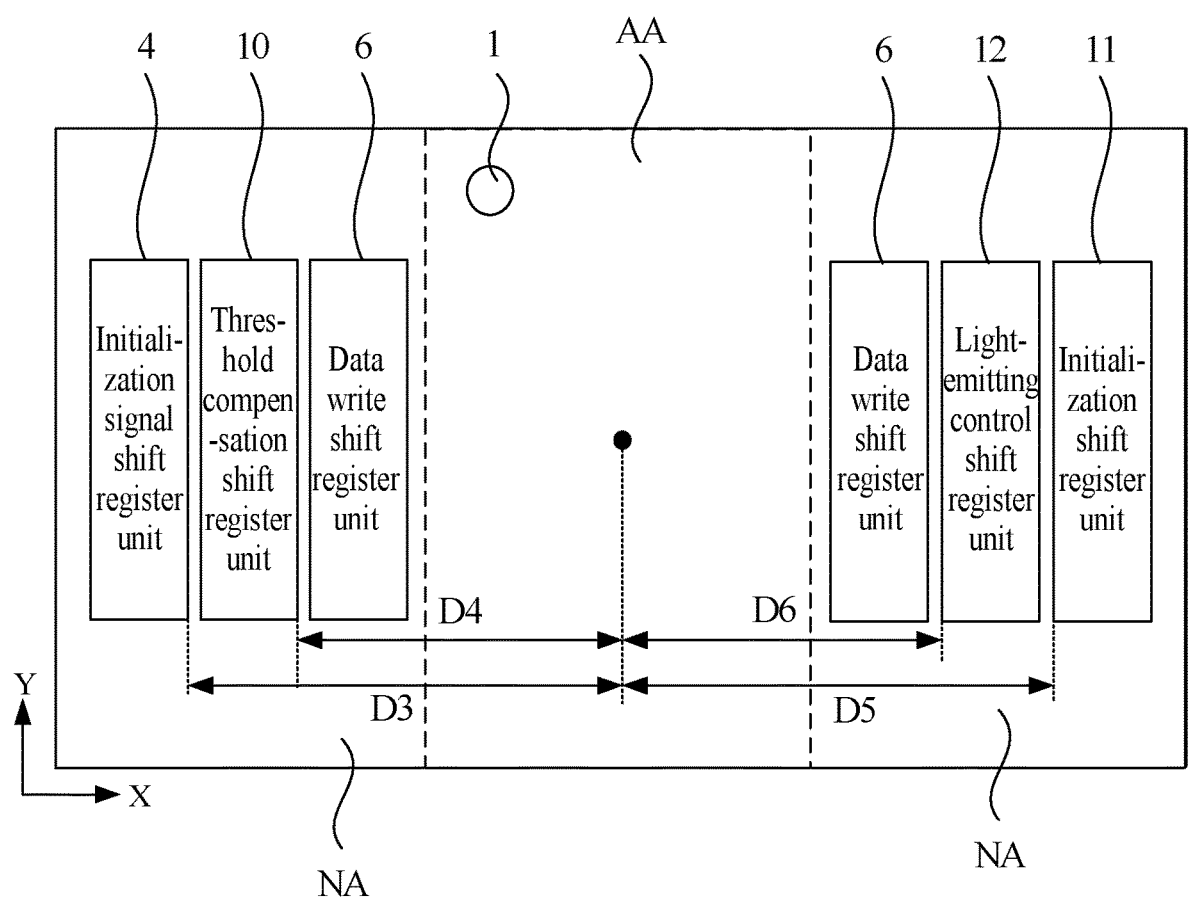
FIG. 9 is a structure view of another display panel according to an embodiment of the present disclosure.

In an embodiment, FIG. 9 is a structure view of another display panel according to an embodiment of the present disclosure. As shown in FIG. 9, in another embodiment, an initialization signal shift register unit 4 and a threshold compensation shift register unit 10 are both located on the same side of a display region AA in a first direction X. A light-emitting control shift register unit 12 and an initialization shift register unit 11 are both located on the same side of the display region AA in the first direction X.

In an embodiment, as shown in FIG. 9, the initialization signal shift register unit 4 and the threshold compensation shift register unit 10 may be both disposed in the non-display region NA on the same side of the display region AA in the first direction X. That is, the initialization signal shift register unit 4 and the threshold compensation shift register unit 10 are both located on the same side of the display region AA in the first direction X. Meanwhile, the light-emitting control shift register unit 12 and the initialization shift register unit 11 may be disposed in the non-display region NA on the same side. That is, the light-emitting control shift register unit 12 and the initialization shift register unit 11 are both located on the same side of the display region AA in the first direction X. Exemplarily, in FIG. 9, the initialization signal shift register unit 4 and the threshold compensation shift register unit 10 are disposed in the non-display region NA on a first side of the display region AA. The light-emitting control shift register unit 12 and the initialization shift register unit 11 are disposed in the non-display region NA on a second side of the display region AA. The actual situation is not limited thereto.

The position relationship of the initialization signal shift register unit 4 and the threshold compensation shift register unit 10 in the same non-display region NA and the position relationship of the initialization signal shift register unit 11 and the light-emitting control shift register unit 12 in the same non-display region NA are not limited in the embodiments of the present disclosure and can be set by those skilled in the art according to actual requirements. FIG. 9 only exemplarily shows an optional relative position relationship of the preceding units.

Still referring to FIG. 9, in the embodiments of the present disclosure, it may be set that the initialization signal shift register unit 4 is located on one side of the threshold compensation shift register unit 10 facing away from the display region AA in the first direction X and the initialization shift register unit 11 to be located on one side of the light-emitting control shift register unit 12 facing away from the display region AA in the first direction X.

In an embodiment, as shown in FIG. 9, in the first direction X, the initialization signal shift register unit 4 is located on one side of the threshold compensation shift register unit 10 facing away from the display region AA. That is, the distance D3 between the vertical projection of the initialization signal shift register unit 4 in the first direction X and the vertical projection of the center of the display region AA in the first direction X is larger than the distance D4 between the vertical projection of the threshold compensation shift register unit 10 in the first direction X and the vertical projection of the center of the display region AA in the first direction X. Meanwhile, the initialization shift register unit 11 is located on one side of the light-emitting control shift register unit 12 facing away from the display region AA. That is, the distance D5 between the vertical projection of the initialization shift register unit 11 in the first direction X and the vertical projection of the center of the display region AA in the first direction X is larger than the distance D6 between the vertical projection of the light-emitting control shift register unit 12 in the first direction X and the vertical projection of the center of the display region AA in the first direction X.

Figure 10:
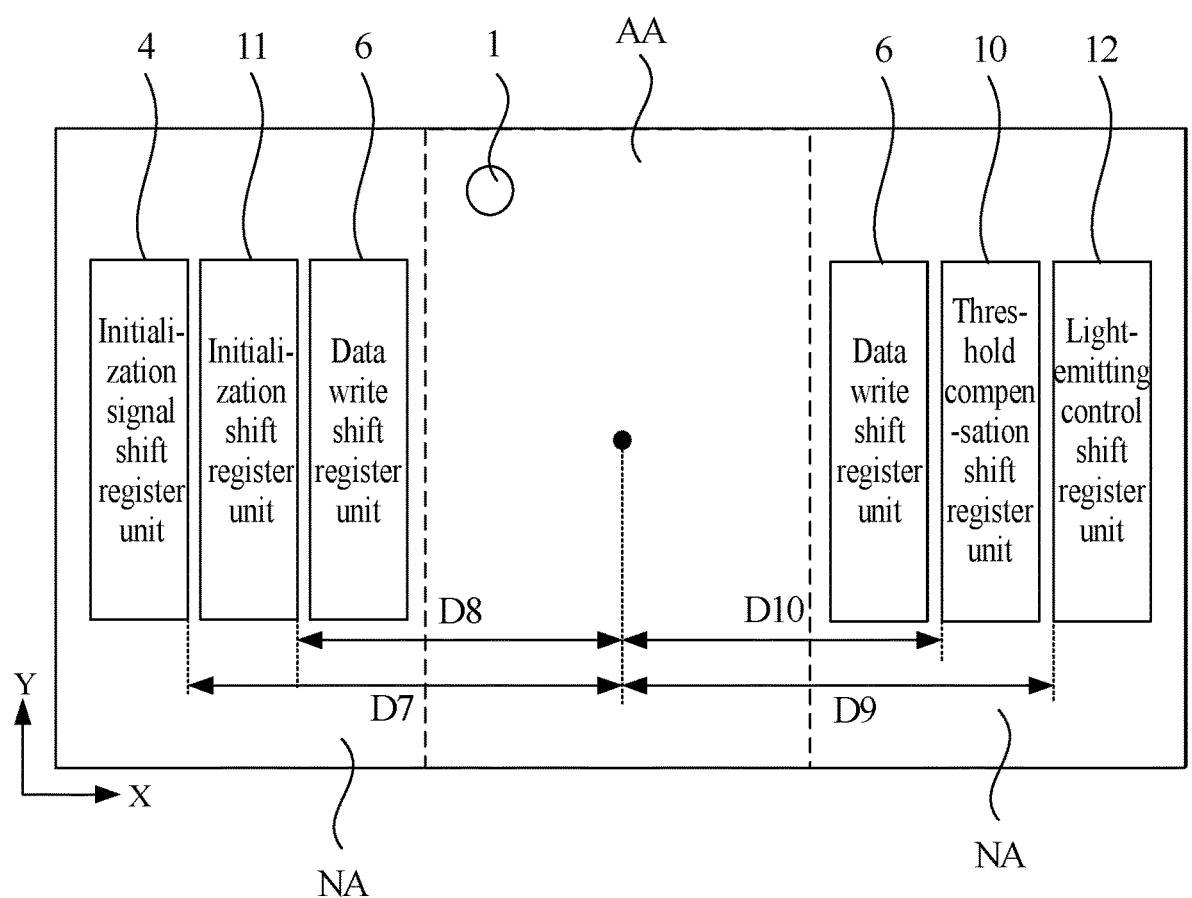
FIG. 10 is a structure view of another display panel according to an embodiment of the present disclosure.

In an embodiment, FIG. 10 is a structure view of another display panel according to an embodiment of the present disclosure. As shown in FIG. 10, in the present embodiment, an initialization signal shift register unit 4 and an initialization shift register unit 11 are both located on the same side of a display region AA in a first direction X, and a light-emitting control shift register unit 12 and a threshold compensation shift register unit 10 are both located on the same side of the display region AA in the first direction X.

In an embodiment, referring to FIG. 10, in the first direction X, the initialization signal shift register unit 4 and the initialization shift register unit 11 are both located on the same side of the display region AA. That is, the initialization signal shift register unit 4 and the initialization shift register unit 11 are disposed in a non-display region NA on the same side of the display region AA. For example, in FIG. 10, the initialization signal shift register unit 4 and the initialization shift register unit 11 are both disposed in the non-display region NA on a first side of the display region AA. Meanwhile, the light-emitting control shift register unit 12 and the threshold compensation shift register unit 10 are located on the same side of the display region AA in the first direction X. That is, the light-emitting control shift register unit 12 and the threshold compensation shift register unit 10 are disposed in the non-display region NA on the same side of the display region AA. For example, in FIG. 10, the light-emitting control shift register unit 12 and the threshold compensation shift register unit 10 are both disposed in the non-display region NA on a second side of the display region AA.

The position relationship of the initialization signal shift register unit 4 and the initialization shift register unit 11 in the same non-display region NA and the position relationship of the light-emitting control shift register unit 12 and the threshold compensation shift register unit 10 in the same non-display region NA are not limited in the embodiments of the present disclosure and can be set by those skilled in the art according to actual requirements. FIG. 10 only exemplarily shows an optional relative position relationship of the preceding units.

Referring to FIG. 10, in the embodiments of the present disclosure, it may be set that the initialization signal shift register unit 4 is located on one side of the initialization shift register unit 11 facing away from the display region AA in the first direction X and the light-emitting control shift register unit 12 is located on one side of the threshold compensation shift register unit 10 facing away from the display region AA in the first direction X.

In an embodiment, as shown in FIG. 10, in the first direction X, the initialization signal shift register unit 4 is located on one side of the initialization shift register unit 11 facing away from the display region AA. That is, the distance D7 between the vertical projection of the initialization signal shift register unit 4 in the first direction X and the vertical projection of the center of the display region AA in the first direction X is larger than the distance D8 between the vertical projection of the initialization shift register unit 11 in the first direction X and the vertical projection of the center of the display region AA in the first direction X. Meanwhile, the light-emitting control shift register unit 12 is located on one side of the threshold compensation shift register unit 10 facing away from the display region AA. That is, the distance D9 between the vertical projection of the light-emitting control shift register unit 12 in the first direction X and the vertical projection of the center of the display region AA in the first direction X is larger than the distance D10 between the vertical projection of the threshold compensation shift register unit 10 in the first direction X and the vertical projection of the center of the display region AA in the first direction X.

Figure 11:
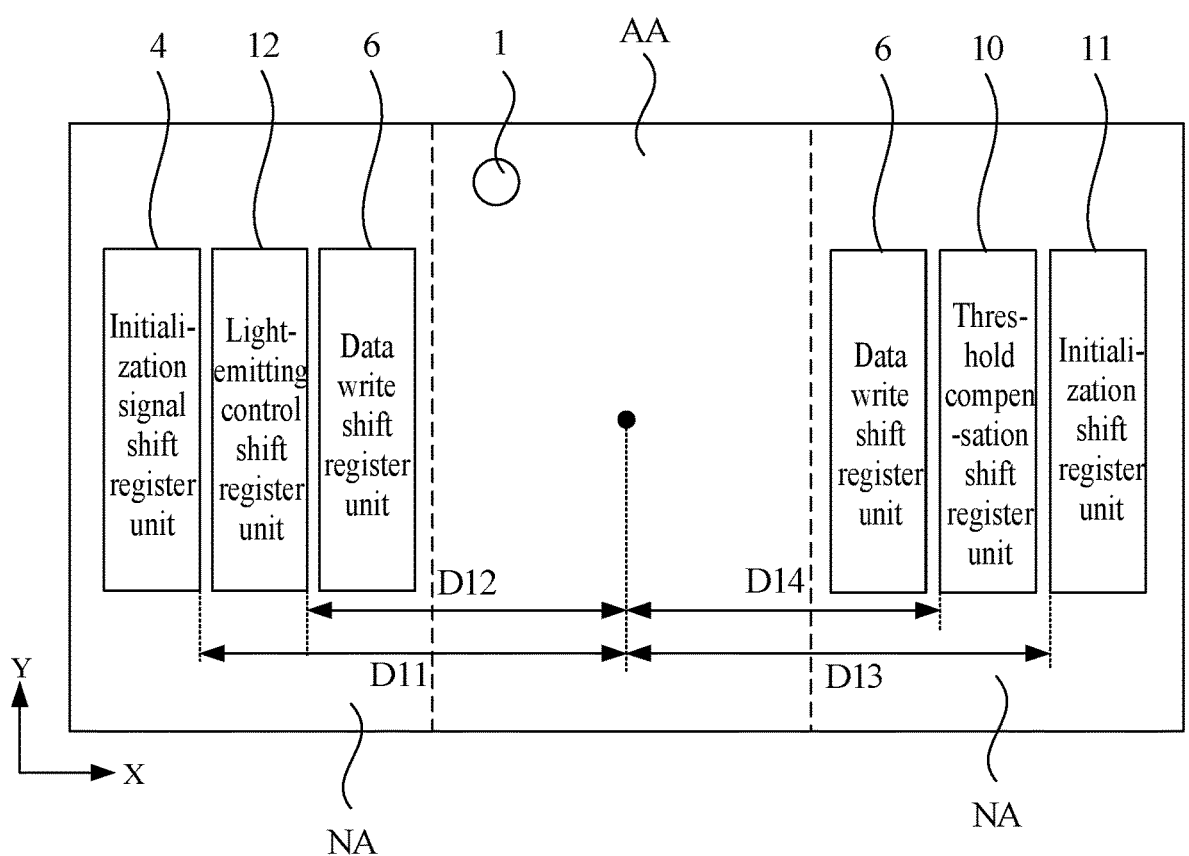
FIG. 11 is a structure view of another display panel according to an embodiment of the present disclosure.
Figure 12:
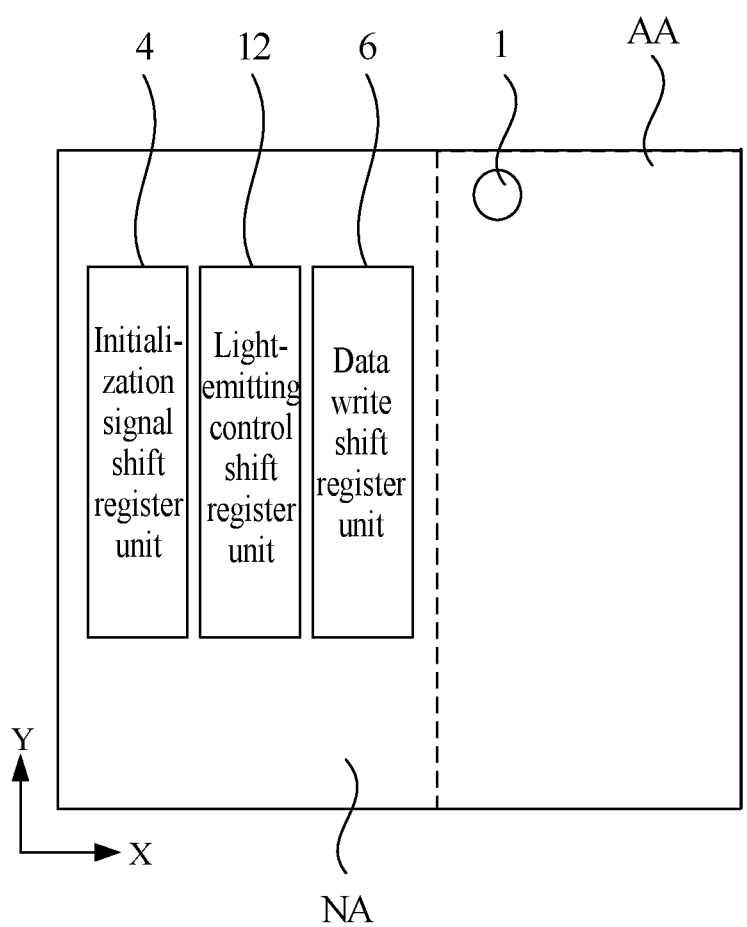
FIG. 12 is a structure view of another display panel according to an embodiment of the present disclosure.
Figure 13:
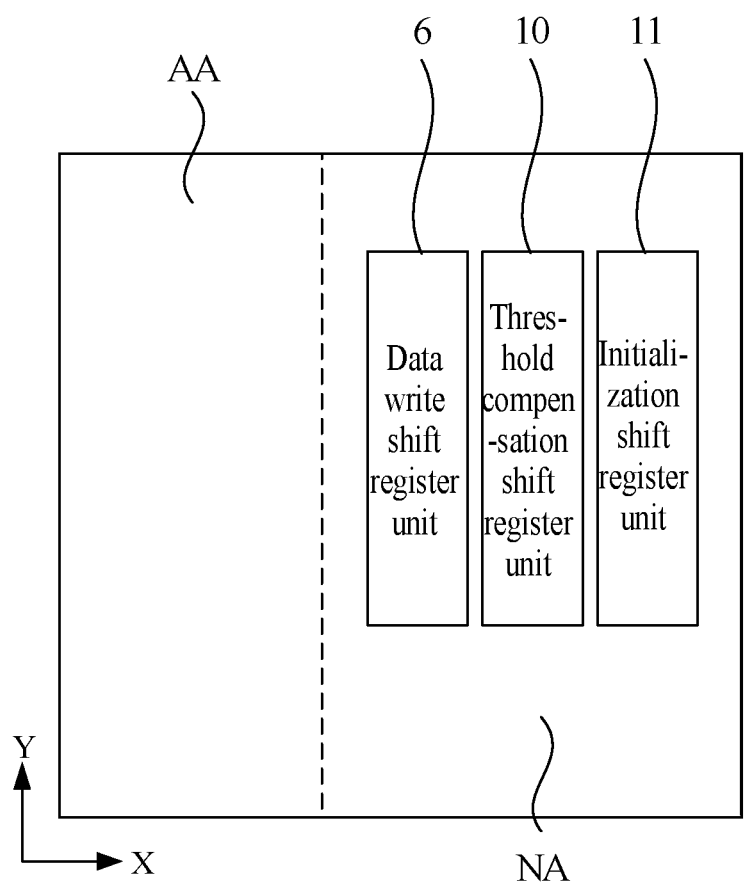
FIG. 13 is a structure view of another display panel according to an embodiment of the present disclosure.

FIG. 11 is a structure view of another display panel according to an embodiment of the present disclosure. FIG. 12 is a structure view of another display panel according to an embodiment of the present disclosure. FIG. 13 is a structure view of another display panel according to an embodiment of the present disclosure. As shown in FIGS. 11 to 13, in the present embodiment, initialization signal shift register units 4 are all located on the same side of a display region AA in a first direction X, and an initialization signal shift register unit 4 and a light-emitting control shift register unit 12 are both located on the same side of the display region AA in the first direction X; and/or a threshold compensation shift register unit 10 and an initialization shift register unit 11 are both located on the same side of the display region AA in the first direction X.

In an embodiment, referring to FIG. 11, in the first direction X, it may be set that the initialization signal shift register units 4 are all located on the same side of the display region AA. That is, the initialization signal shift register units 4 are disposed in the non-display region NA on only one side of the display region AA. For example, in FIG. 11, the initialization signal shift register units 4 are disposed in the non-display region NA on a first side of the display region AA. Meanwhile, the initialization signal shift register unit 4 and the light-emitting control shift register unit 12 are set to be located on the same side of the display region AA. That is, the light-emitting control shift register unit 12 and the initialization signal shift register unit 4 are disposed in the non-display region NA on the same side of the display region AA. For example, in FIG. 11, the light-emitting control shift register unit 12 and the initialization signal shift register unit 4 are disposed in the non-display region NA on the first side of the display region AA. In addition, it may also be set that the threshold compensation shift register unit 10 and the initialization shift register unit 11 are located on the same side of the display region AA in the first direction X. For example, as shown in FIG. 11, the threshold compensation shift register unit 10 and the initialization shift register unit 11 are both disposed in the non-display region NA on a second side of the display region AA.

In an embodiment, as shown in FIG. 12, it may also be set that the initialization signal shift register units 4 are located on the same side of the display region AA in the first direction X, the light-emitting control shift register unit 12 and the initialization signal shift register unit 4 are disposed in the non-display region NA on the same side of the display region AA, and the specific setting positions of the threshold compensation shift register unit 10 and the initialization shift register unit 11 are not limited. As shown in FIG. 13, it may also be set that the threshold compensation shift register unit 10 and the initialization shift register unit 11 are located only in the same non-display region NA in the first direction X. The specific setting positions of the light-emitting control shift register unit 12 and the initialization signal shift register unit 4 are not limited.

In addition, the relative position relationship of the preceding units in the non-display region NA is not limited in the embodiments of the present disclosure and can be set by those skilled in the art according to actual requirements. FIGS. 11 to 13 only exemplarily show several possible specific implementation modes.

Exemplarily, still referring to FIG. 11, it may be set that the initialization signal shift register unit 4 is located on one side of the light-emitting control shift register unit 12 facing away from the display region AA in the first direction X and the initialization shift register unit 11 is located on one side of the threshold compensation shift register unit 10 facing away from the display region AA in the first direction X.

In an embodiment, as shown in FIG. 11, in the first direction X, it may be set that the initialization signal shift register unit 4 is located on one side of the light-emitting control shift register unit 12 facing away from the display region AA. That is, the distance D11 between the vertical projection of the initialization signal shift register unit 4 in the first direction X and the vertical projection of the center of the display region AA in the first direction X is larger than the distance D12 between the vertical projection of the center of the light-emitting control shift register unit 12 in the first direction X and the vertical projection of the center of the display region AA in the first direction X. Meanwhile, the initialization shift register unit 11 is located on one side of the threshold compensation shift register unit 10 facing away from the display region AA. That is, the distance D13 between the vertical projection of the initialization shift register unit 11 in the first direction X and the vertical projection of the center of the display region AA in the first direction X is larger than the distance D14 between the vertical projection of the threshold compensation shift register unit 10 in the first direction X and the vertical projection of the center of the display region AA in the first direction X.

In addition, the specific setting position of a data write shift register unit 6 in the non-display region NA of the display panel is not limited in the embodiments of the present disclosure and can be set by those skilled in the art according to actual requirements.

Exemplarily, referring to FIGS. 8 to 11, it may be set that the data write shift register unit 6 is located between the display region AA and any one of the initialization signal shift register unit 4, the threshold compensation shift register unit 10, the initialization shift register unit 11, and the light-emitting control shift register unit 12 in the first direction X.

Apparently, the specific setting modes of the initialization signal shift register unit 4, the threshold compensation shift register unit 10, the initialization shift register unit 11, the data write shift register unit 6, and the light-emitting control shift register unit 12 are not limited to those shown in the preceding embodiments. In the actual application, the specific setting positions of the preceding units in the non-display region NA may also be adjusted by those skilled in the art according to actual requirements.

It is to be understood that to illustrate the specific setting mode of the preceding shift register units in the non-display region of the display panel, FIGS. 8 to 13 only exemplarily show one initialization signal shift register unit 4, one threshold compensation shift register unit 10, one initialization shift register unit 11, one data write shift register unit 6, and one light-emitting control shift register unit 12 in the non-display region on the first side or the second side of the display region. In the actual setting situation, a plurality of cascaded initialization signal shift register units, one threshold compensation shift register unit 10, one initialization shift register unit 11, one data write shift register unit 6, and one light-emitting control shift register unit 12 should be included. As shown in FIGS. 8 to 13, those skilled in the art should know the setting modes of all of the shift register units.

Figure 14:
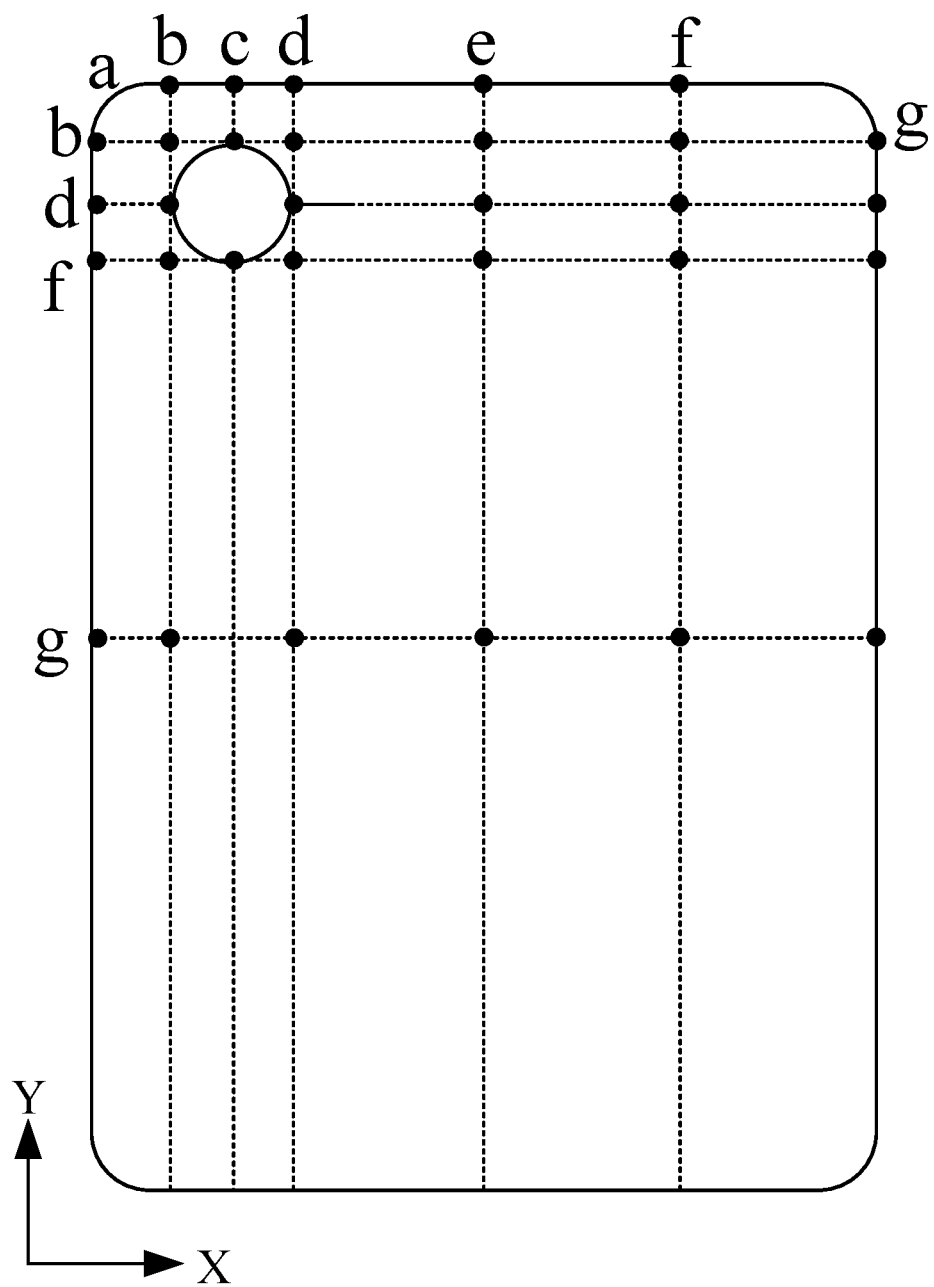
FIG. 14 is a schematic view of pixel points for the brightness test of a display panel according to an embodiment of the present disclosure.

In addition, in the embodiments of the present disclosure, the display brightness of the display panel is also tested in the setting modes of the shift register units as shown in FIGS. 9 to 11 separately. FIG. 14 is a schematic view of pixel points for the brightness test of a display panel according to an embodiment of the present disclosure. Table 1 is a table of brightness values for different points of a display panel according to an embodiment of the present disclosure. Table 2 is a table of brightness variation data for different points of a display panel according to an embodiment of the present disclosure. Data in Tables 1 and 2 correspond to test data of the display panel shown in FIG. 9.

Table 3 is a table of brightness values for different points of another display panel according to an embodiment of the present disclosure. Table 4 is a table of brightness variation data for different points of another display panel according to an embodiment of the present disclosure. Data in Table 3 and Table 4 correspond to test data of the display panel shown in FIG. 10.

Table 5 is a table of brightness values for different points of another display panel according to an embodiment of the present disclosure. Table 6 is a table of brightness variation data for different points of another display panel according to an embodiment of the present disclosure. Data in Table 5 and Table 6 correspond to test data of the display panel shown in FIG. 11. The brightness difference of the display panel in different setting modes of the shift register units is analyzed in conjunction with FIGS. 9 to 11 and Tables 1 to 6.

In Tables 1, 3, and 5, in the row direction, brightness values for pixel points arranged in the first direction X on the display panel are shown, and in the column direction, brightness values for pixel points arranged in the second direction Y on the display panel are shown. The brightness corresponding to pixel point e.g., at the symmetrical center of the display panel is the reference brightness. Percentages of brightness variation differences for the pixel points in Table 1 are shown in Tables 2, 4, and 6.

TABLE 1

| | B 2 nit pA | | | | | | |
| --- | --- | --- | --- | --- | --- | --- | --- |
| | a | b | c | d | e | f | g |
| b | 361.79 | 366.32 | 369.47 | 371.07 | 384.52 | 380.66 | 365.91 |
| d | 377.14 | 381.89 | Hole-digging region | 396.92 | 415.38 | 413.47 | 398.79 |
| f | 370.36 | 373.57 | 371.57 | 374.99 | 380.42 | 386.06 | 362.11 |
| g | 367.98 | 374.33 | 377.41 | 379.27 | 393.4 | 389.68 | 373.1 |

TABLE 2

| | \multicolumn{7}{c}{B 2 nit %} |
|---|---|---|---|---|---|---|---|
| | a | b | c | d | e | f | g |
| b | −8.04 | −6.88 | −6.08 | −5.68 | −2.26 | −3.24 | −6.99 |
| d | −4.13 | −2.93 | Hole-digging region | 0.89 | 5.59 | 5.10 | 1.37 |
| f | −5.86 | −5.11 | −5.55 | −4.68 | −3.3 | −1.87 | −7.7 |
| g | −6.46 | −4.85 | −4.06 | −3.59 | 0.00 | −0.95 | −5.16 |

Referring to Tables 1 and 2, in the setting mode of the display panel shown in FIG. 9, among pixel points in the row in which the hole-digging region 1 is located, the maximum percentage of brightness variation difference is 5.59%. Among pixel points not in the row in which the hole-digging region 1 is located, the maximum percentage of brightness variation difference is −8.04%.

TABLE 3

| | \multicolumn{7}{c}{B 2 nit pA} |
|---|---|---|---|---|---|---|---|
| | a | b | c | d | e | f | g |
| b | 373.48 | 377.53 | 380.35 | 381.57 | 389.64 | 381.96 | 363.99 |
| d | 361.65 | 365.21 | Hole-digging region | 370.83 | 380.86 | 375.01 | 356.59 |
| f | 377.06 | 379.19 | 377 | 380.21 | 389.18 | 393.61 | 370.01 |
| g | 381.26 | 386.87 | 389.57 | 391.03 | 398.86 | 390.73 | 370.14 |

TABLE 4

| | \multicolumn{7}{c}{B 2 nit %} |
|---|---|---|---|---|---|---|---|
| | a | b | c | d | e | f | g |
| b | −6.36 | −5.35 | −4.64 | −4.33 | −2.31 | −4.24 | −8.74 |
| d | −9.33 | −8.44 | Hole-digging region | −7.03 | −4.51 | −5.98 | −10.10 |
| f | −5.47 | −4.93 | −5.48 | −4.68 | −3.18 | −1.32 | −7.23 |
| g | −4.41 | −3.01 | −2.33 | −1.96 | 0.00 | −2.04 | −7.20 |

Similarly, referring to Tables 3 and 4, in the setting mode of the display panel shown in FIG. 10, among the pixel points in the row in which the hole-digging region 1 is located, the maximum percentage of brightness variation difference is −10.10%. Among the pixel points not in the row in which the hole-digging region 1 is located, the maximum percentage of brightness variation difference is −8.74%.

TABLE 5

| | \multicolumn{7}{c}{B 2 nit pA} |
|---|---|---|---|---|---|---|---|
| | a | b | c | d | e | f | g |
| b | 373.44 | 377.19 | 380.32 | 381.54 | 389.65 | 381.99 | 364.03 |
| d | 361.53 | 365.09 | Hole-digging region | 370.75 | 380.82 | 374.99 | 358.59 |
| f | 370.36 | 373.28 | 371.57 | 374.99 | 380.42 | 386.06 | 363.11 |
| g | 381.2 | 386.82 | 389.53 | 390.99 | 396.86 | 390.75 | 370.17 |

TABLE 6

| | \multicolumn{7}{c}{B 2 nit Δ %} |
|---|---|---|---|---|---|---|---|
| | a | b | c | d | e | f | g |
| b | −6.37 | −5.36 | −4.65 | −4.34 | −2.31 | −4.23 | −8.73 |
| d | −9.36 | −8.47 | Hole-digging region | −7.05 | −4.52 | −5.98 | −10.10 |
| f | −7.15 | −6.41 | −6.84 | −5.98 | −4.62 | −3.21 | −8.96 |
| g | −4.43 | −3.02 | −2.34 | −1.97 | 0.00 | −2.03 | −7.19 |

Similarly, referring to Tables 5 and 6, in the setting mode of the display panel shown in FIG. 11, among the pixel points in the row in which the hole-digging region 1 is located, the maximum percentage of brightness variation difference is −10.10%. Among the pixel points not in the row in which the hole-digging region 1 is located, the maximum percentage of brightness variation difference is −8.96%.

It can be seen from the preceding data, the brightness difference of the pixel points of the display panel shown in FIG. 9 is relatively small so that the display uniformity of the display panel is better. That is, when the initialization signal shift register unit 4 and the threshold compensation shift register unit 10 are both located on the same side of the display region AA in the first direction X, and the light-emitting control shift register unit 12 and the initialization shift register unit 11 are both located on the same side of the display region AA in the first direction X, the display panel has a better display effect.

Based on the same concept, an embodiment of the present disclosure provides a display device. The display device includes the display panel described in any embodiment of the present disclosure. Therefore, the display device provided by this embodiment of the present disclosure has the corresponding beneficial effects of the display panel provided by the embodiments of the present disclosure. The beneficial effects are not repeated here. Exemplarily, the display device may be a mobile phone, a computer, a smart wearable device (such as a smartwatch), an onboard display device, and other electronic devices and is not limited in the embodiments of the present disclosure.

Figure 15:
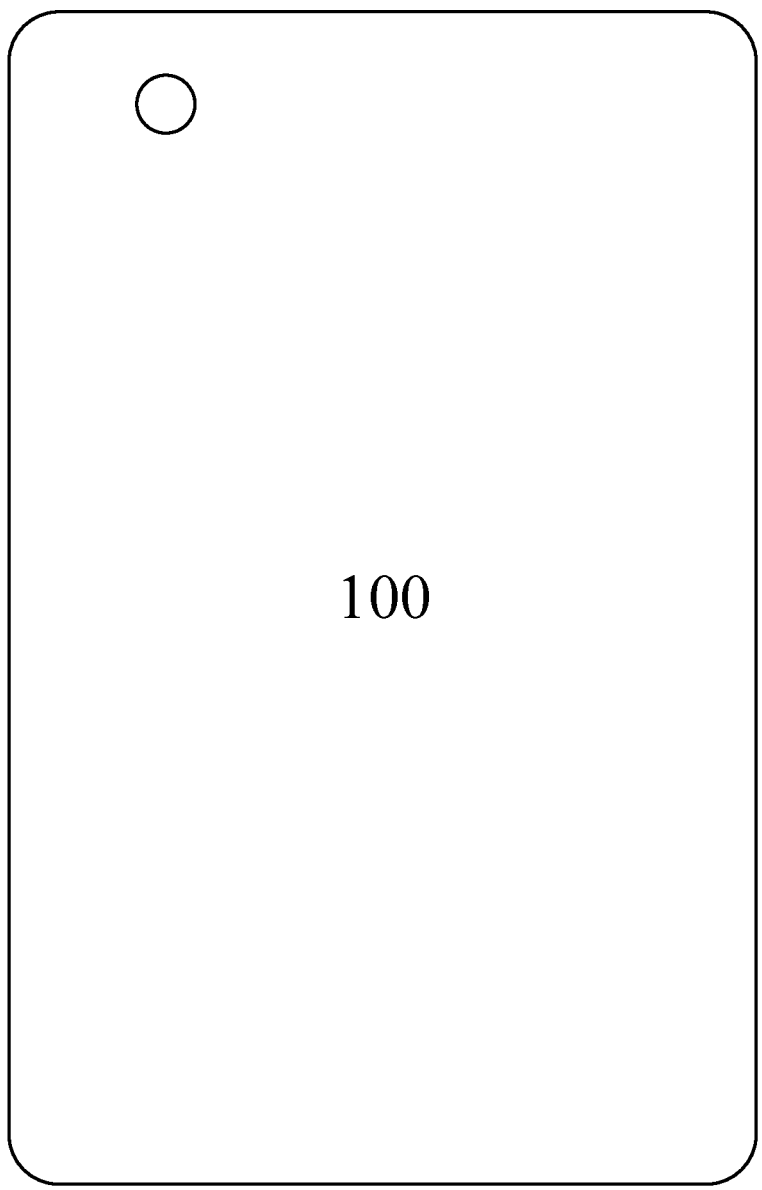
FIG. 15 is a structure view of a display device according to an embodiment of the present disclosure.

Exemplarily, FIG. 15 is a structure view of a display device according to an embodiment of the present disclosure. As shown in FIG. 15, the display device includes the display panel 01 described in the preceding embodiments.

It is to be noted that the preceding are only preferred embodiments of the present disclosure and technical principles used therein. It is to be understood by those skilled in the art that the present disclosure is not limited to the embodiments described herein. Those skilled in the art can make various apparent modifications, adaptations, combinations, and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:
1. A display panel, comprising:
a display region, a non-display region bordering two sides of the display region at least in a first direction, and a hole-digging region,
wherein in the first direction, a distance from the hole-digging region to the non-display region on a first side of the display region is smaller than a distance from the hole-digging region to the non-display region on a second side of the display region, wherein the first side and the second side are opposite in the first direction;

wherein the display region comprises a plurality of pixel circuits and a plurality of initialization signal lines, wherein the plurality of pixel circuits are arranged in an array in the first direction and a second direction, the plurality of initialization signal lines are arranged in sequence in the second direction, and at least part of the plurality of initialization signal lines each has a partial line segment extending around the hole-digging region, wherein the second direction intersects the first direction;

wherein the non-display region comprises a plurality of cascaded initialization signal shift register units, wherein the plurality of initialization signal shift register units are electrically connected to the plurality of initialization signal lines in a one-to-one correspondence, and the plurality of initialization signal shift register units are configured to provide initialization signals to the plurality of pixel circuits through the plurality of initialization signal lines in an initialization stage;

wherein the plurality of initialization signal shift register units comprise a first initialization signal shift register unit located in the non-display region on the first side of the display region in the first direction, and the first initialization signal shift register unit is electrically connected to an initialization signal line that has a partial line segment extending around the hole-digging region and corresponds to the first initialization signal shift register unit;

wherein the plurality of initialization signal shift register units comprise a second initialization signal shift register unit located in the non-display region on the second side of the display region in the first direction, and the second initialization signal shift register unit is electrically connected to an initialization signal line that has a partial line segment extending around the hole-digging region and corresponds to the second initialization signal shift register unit; and wherein in the initialization stage, an absolute value of a first initialization signal provided by the first initialization signal shift register unit is smaller than an absolute value of a second initialization signal provided by the second initialization signal shift register unit.

2. The display panel according to claim 1, wherein each pixel circuit of the plurality of pixel circuits comprises a drive unit; and in pixel circuits arranged in sequence in the first direction among the plurality of pixel circuits, one of a control terminal, an input terminal or an output terminal of each drive unit is electrically connected to a same initialization signal line of the plurality of initialization signal lines.

3. The display panel according to claim 2, wherein in the pixel circuits arranged in sequence in the first direction among the plurality of pixel circuits, the input terminal or the output terminal of each drive unit is electrically connected to the same initialization signal line of the plurality of initialization signal lines; and the plurality of initialization signal shift register units are further configured to provide bias signals to the plurality of pixel circuits through the plurality of initialization signal lines in a bias stage.

4. The display panel according to claim 3, wherein in the bias stage, a first bias signal provided by the first initialization signal shift register unit is smaller than a second bias signal provided by the second initialization signal shift register unit.

5. The display panel according to claim 3, wherein a ratio of the first initialization signal provided by the first initialization signal shift register unit in the initialization stage to a first bias signal provided by the first initialization signal shift register unit in the bias stage is equal to a ratio of the second initialization signal provided by the second initialization signal shift register unit in the initialization stage to a second bias signal provided by the second initialization signal shift register unit in the bias stage.

6. The display panel according to claim 1, wherein the display region further comprises a plurality of data write scan signal lines arranged in sequence in the second direction;

each pixel circuit of the plurality of pixel circuits comprises a data write unit, in pixel circuits arranged in sequence in the first direction among the plurality of pixel circuits, a control terminal of each data write unit is electrically connected to a same data write scan signal line of the plurality of data write scan signal lines; and the non-display region further comprises a plurality of cascaded data write shift register units, two ends of a data write scan signal line of the plurality of data write scan signal lines are each connected to a data write shift register unit of the plurality of data write shift register units, and the data write shift register unit is configured to provide a data write control signal to a control terminal of a data write unit corresponding to and electrically connected to the data write shift register unit.

7. The display panel according to claim 6, wherein the display region further comprises a plurality of threshold compensation scan signal lines, a plurality of initialization scan signal lines, and a plurality of light-emitting control scan signal lines; and the plurality of threshold compensation scan signal lines are arranged in sequence in the second direction, the plurality of initialization scan signal lines are arranged in sequence in the second direction, and the plurality of light-emitting control scan signal lines are arranged in sequence in the second direction;

each pixel circuit of the plurality of pixel circuits comprises a threshold compensation unit, an initialization unit, and a light-emitting control unit; and in pixel circuits arranged in sequence in the first direction among the plurality of pixel circuits, a control terminal of each threshold compensation unit is electrically connected to a same threshold compensation scan signal line of the plurality of threshold compensation scan signal lines, a control terminal of each initialization unit is electrically connected to a same initialization scan signal line of the plurality of initialization scan signal lines, and a control terminal of each light-emitting control unit is electrically connected to a same light-emitting control scan signal line of the plurality of light-emitting control scan signal lines;

the non-display region further comprises a plurality of cascaded threshold compensation shift register units, a plurality of cascaded initialization shift register units, and a plurality of cascaded light-emitting control shift register units;

the plurality of threshold compensation shift register units are electrically connected to the plurality of threshold compensation scan signal lines in a one-to-one correspondence, and a threshold compensation shift register unit of the plurality of threshold compensation shift register units is configured to provide a threshold compensation control signal to a control terminal of a threshold compensation unit corresponding to and electrically connected to the threshold compensation shift register unit;

the plurality of initialization shift register units are electrically connected to the plurality of initialization scan signal lines in a one-to-one correspondence, and an initialization shift register unit of the plurality of initialization shift register units is configured to provide an initialization control signal to a control terminal of an initialization unit corresponding to and electrically connected to the initialization shift register unit; and the plurality of light-emitting control shift register units are electrically connected to the plurality of light-emitting control scan signal lines in a one-to-one correspondence, and a light-emitting control shift register unit of the plurality of light-emitting control shift register units is configured to provide a light-emitting control signal to a control terminal of a light-emitting control unit corresponding to and electrically connected to the light-emitting control shift register unit.

8. The display panel according to claim 7, wherein the threshold compensation shift register unit is located in the non-display region on one side of the display region and the initialization shift register unit is located in the non-display region on another side of the display region in the first direction, respectively.

9. The display panel according to claim 7, wherein the plurality of initialization signal shift register units are all located on a same side of the display region in the first direction, and an initialization signal shift register unit of the plurality of initialization signal shift register units and the light-emitting control shift register unit are located in the non-display region on two sides of the display region in the first direction respectively.

10. The display panel according to claim 9, wherein
the initialization signal shift register unit and the threshold compensation shift register unit are both located on a same side of the display region in the first direction; and
the light-emitting control shift register unit and the initialization shift register unit are both located on a same side of the display region in the first direction.

11. The display panel according to claim 10, wherein
the initialization signal shift register unit is located on one side of the threshold compensation shift register unit facing away from the display region in the first direction; and
the initialization shift register unit is located on one side of the light-emitting control shift register unit facing away from the display region in the first direction.

12. The display panel according to claim 10, wherein the data write shift register unit is located between the display region and one of the initialization signal shift register unit, the threshold compensation shift register unit, the initialization shift register unit, or the light-emitting control shift register unit in the first direction.

13. The display panel according to claim 9, wherein
the initialization signal shift register unit and the initialization shift register unit are both located on a same side of the display region in the first direction; and
the light-emitting control shift register unit and the threshold compensation shift register unit are both located on a same side of the display region in the first direction.

14. The display panel according to claim 13, wherein
the initialization signal shift register unit is located on one side of the initialization shift register unit facing away from the display region in the first direction; and
the light-emitting control shift register unit is located on one side of the threshold compensation shift register unit facing away from the display region in the first direction.

15. The display panel according to claim 7, wherein
the plurality of initialization signal shift register units are all located on a same side of the display region in the first direction, and an initialization signal shift register unit of the plurality of initialization signal shift register units and the light-emitting control shift register unit are both located on a same side of the display region in the first direction;
the threshold compensation shift register unit and the initialization shift register unit are both located on a same side of the display region in the first direction; or
the plurality of initialization signal shift register units are all located on a same side of the display region in the first direction, an initialization signal shift register unit of the plurality of initialization signal shift register units and the light-emitting control shift register unit are both located on a same side of the display region in the first direction, and the threshold compensation shift register unit and the initialization shift register unit are both located on a same side of the display region in the first direction.

16. The display panel according to claim 15, wherein
the plurality of initialization signal shift register units are located on one side of the light-emitting control shift register unit facing away from the display region in the first direction; and
the initialization shift register unit is located on one side of the threshold compensation shift register unit facing away from the display region in the first direction.

17. A display device, comprising: a display panel comprising a display region, a non-display region bordering two sides of the display region at least in a first direction, and a hole-digging region,
wherein in the first direction, a distance from the hole-digging region to the non-display region on a first side of the display region is smaller than a distance from the hole-digging region to the non-display region on a second side of the display region, wherein the first side and the second side are opposite in the first direction;
wherein the display region comprises a plurality of pixel circuits and a plurality of initialization signal lines, wherein the plurality of pixel circuits are arranged in an array in the first direction and a second direction, the plurality of initialization signal lines are arranged in sequence in the second direction, and at least part of the plurality of initialization signal lines each has a partial line segment extending around the hole-digging region, wherein the second direction intersects the first direction;
wherein the non-display region comprises a plurality of cascaded initialization signal shift register units, wherein the plurality of initialization signal shift register units are electrically connected to the plurality of initialization signal lines in a one-to-one correspondence, and the plurality of initialization signal shift register units are configured to provide initialization signals to the plurality of pixel circuits through the plurality of initialization signal lines in an initialization stage;

wherein the plurality of initialization signal shift register units comprise a first initialization signal shift register unit located in the non-display region on the first side of the display region in the first direction, and the first initialization signal shift register unit is electrically connected to an initialization signal line that has a partial line segment extending around the hole-digging region and corresponds to the first initialization signal shift register unit;

wherein the plurality of initialization signal shift register units comprise a second initialization signal shift register unit located in the non-display region on the second side of the display region in the first direction, and the second initialization signal shift register unit is electrically connected to an initialization signal line that has a partial line segment extending around the hole-digging region and corresponds to the second initialization signal shift register unit; and wherein in the initialization stage, an absolute value of a first initialization signal provided by the first initialization signal shift register unit is smaller than an absolute value of a second initialization signal provided by the second initialization signal shift register unit.

* * * * *